US010283650B2

(12) United States Patent
Li et al.

(10) Patent No.: US 10,283,650 B2
(45) Date of Patent: May 7, 2019

(54) SILICON ON INSULATOR (SOI) TRANSCAP INTEGRATION PROVIDING FRONT AND BACK GATE CAPACITANCE TUNING

(71) Applicant: QUALCOMM Incorporated, San Diego, CA (US)

(72) Inventors: Xia Li, San Diego, CA (US); Bin Yang, San Diego, CA (US); Gengming Tao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/659,718

(22) Filed: Jul. 26, 2017

(65) Prior Publication Data

US 2019/0035945 A1 Jan. 31, 2019

(51) Int. Cl.
*H01L 27/108* (2006.01)
*H01L 29/94* (2006.01)
(Continued)

(52) U.S. Cl.
CPC .......... *H01L 29/94* (2013.01); *H01L 29/0649* (2013.01); *H01L 29/66189* (2013.01); *H01L 29/93* (2013.01)

(58) Field of Classification Search
CPC ... H01L 29/93; H01L 29/94; H01L 29/66174; H01L 29/66189; H01L 29/7391; H01L 27/0808; H01L 29/0649; H01L 21/28052; H01L 21/28518; H01L 24/08; H01L 27/0805; H01L 29/0615; H01L 29/0692;
(Continued)

(56) References Cited

U.S. PATENT DOCUMENTS 6,100,567 A 8/2000 Burr
8,216,890 B2 7/2012 Johnson et al.
(Continued)

OTHER PUBLICATIONS

Broadcom UK Ltd: "Co-existence and Mitigation Techniques TR 103 319", ETSI Draft; BRAN(15) 000192R2, European Telecommunications Standards Institute (ETSI), 650, Route Des Lucioles ; F-06921 Sophia-Antipolis ; France, vol. BRAN—Broadband Radio Access Networks, Feb. 7, 2016, XP014267797, Retrieved from the Internet: URL:docbox.etsi.org\BRAN\BRAN\05-CONTRIBUTIONS\2015\BRAN(15)000192r2_Co-existence_and_Mitigation_Techniques_TR_103_319.doc [retrieved on Feb. 7, 2016], pp. 1-13.
(Continued)

*Primary Examiner* — Meiya Li
(74) *Attorney, Agent, or Firm* — Patterson & Sheridan, L.L.P

(57) ABSTRACT

Certain aspects of the present disclosure generally relate to a semiconductor variable capacitor offering at least two types of capacitance tuning, as well as techniques for fabricating the same. For example, a CMOS-compatible silicon on insulator (SOI) process with a buried oxide (BOX) layer may provide a transcap with a front gate (above the BOX layer) and a back gate (beneath the BOX layer). The front gate may offer lower voltage, coarse capacitance tuning, whereas the back gate may offer higher voltage, fine capacitance tuning. By offering both types of capacitance tuning, such transcaps may provide greater capacitance resolution. Several variations of transcaps with front gate and back gate tuning are illustrated and described herein.

30 Claims, 21 Drawing Sheets

(51) Int. Cl.
*H01L 29/66* (2006.01)
*H01L 29/93* (2006.01)
*H01L 29/06* (2006.01)

(58) Field of Classification Search
CPC ............... H01L 29/456; H01L 29/4933; H01L 27/1203; H01L 27/108; H01L 27/10805; H01L 28/40; H01L 28/55; H01L 29/68; H01L 29/92
See application file for complete search history.

(56) References Cited

U.S. PATENT DOCUMENTS

| | | | |
|---|---|---|---|
| 8,536,649 | B2 | 9/2013 | Wang et al. |
| 8,803,288 | B1 | 8/2014 | Marino et al. |
| 9,214,512 | B2 * | 12/2015 | Marino ............... H01L 29/0615 |
| 9,401,436 | B2 * | 7/2016 | Marino ................... H01L 29/94 |
| 9,646,963 | B1 | 5/2017 | Sun et al. |
| 2009/0057746 | A1 | 3/2009 | Sugll et al. |
| 2011/0291171 | A1 | 12/2011 | Pekarik et al. |
| 2014/0332928 | A1 * | 11/2014 | Marino ................... H01L 29/93 |
| | | | 257/602 |
| 2017/0040461 | A1 | 2/2017 | Tarakji |

OTHER PUBLICATIONS

International Search Report and Written Opinion—PCT/US2018/038916—ISA/EPO—dated Sep. 27, 2018.

* cited by examiner

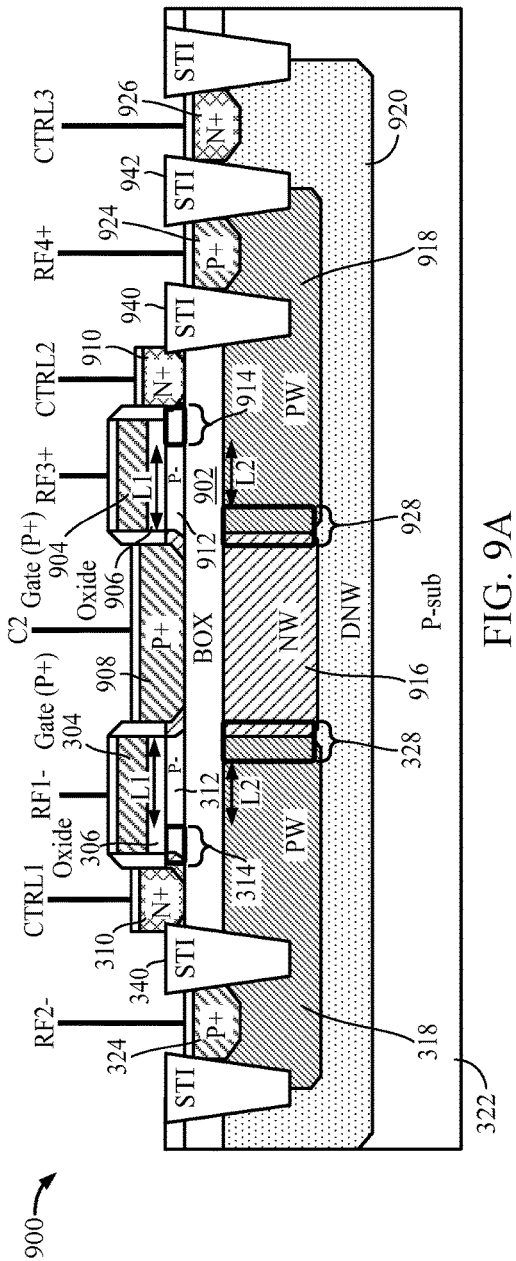
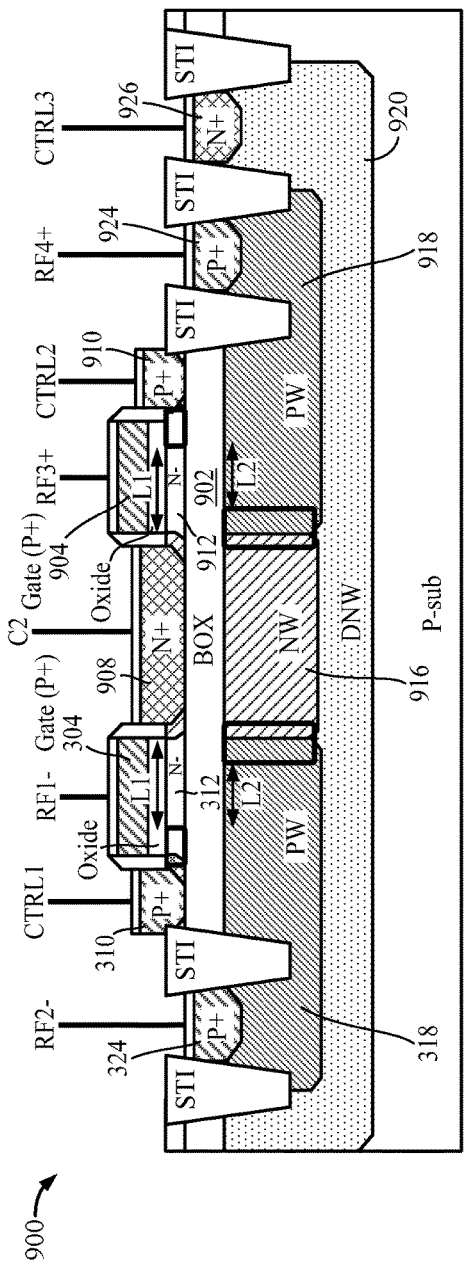
FIG. 9A
FIG. 9B

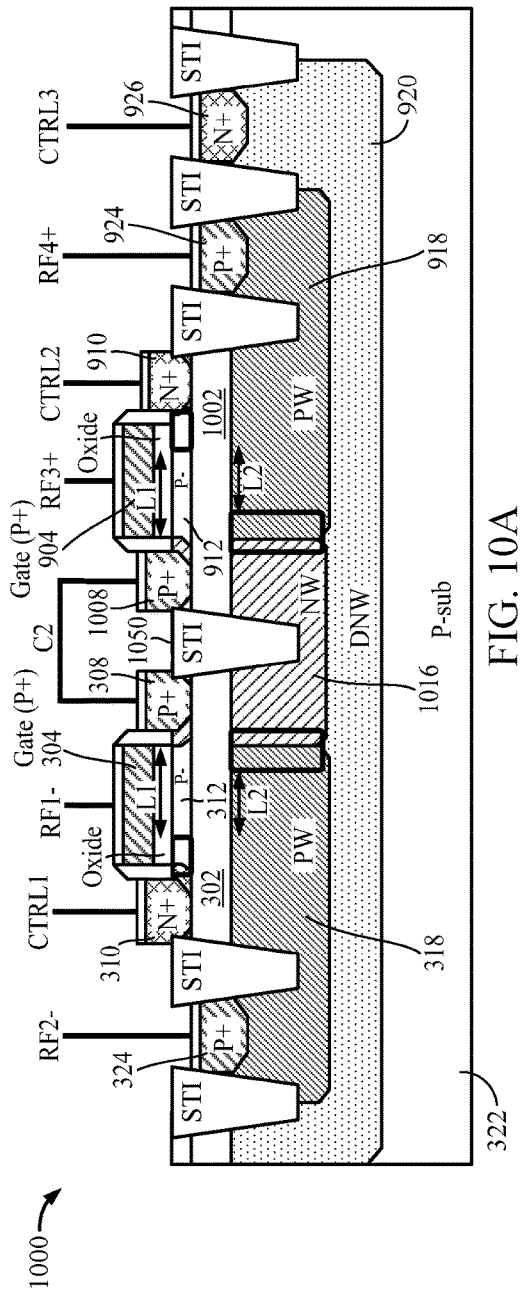
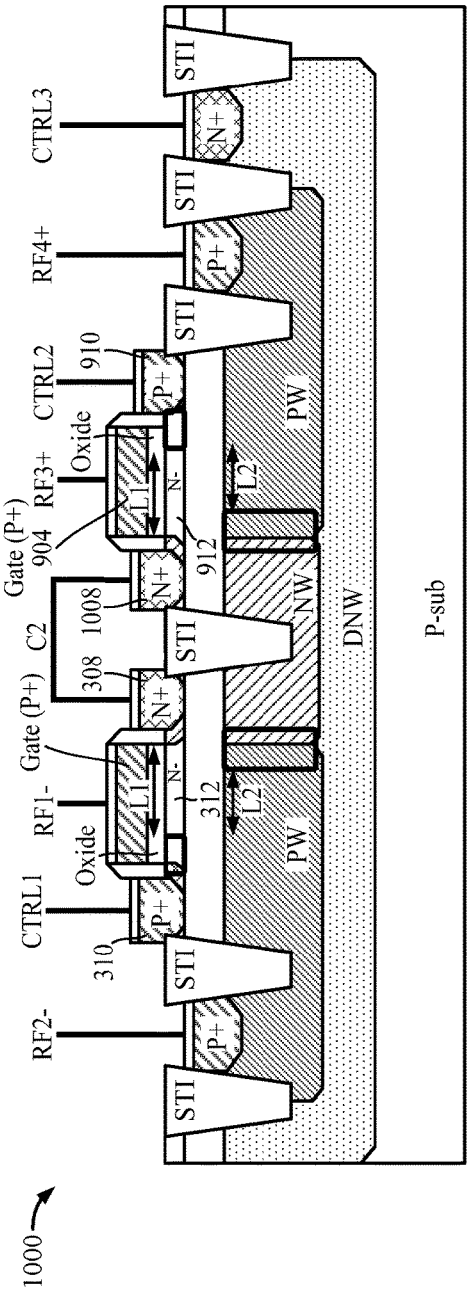
FIG. 10A
FIG. 10B

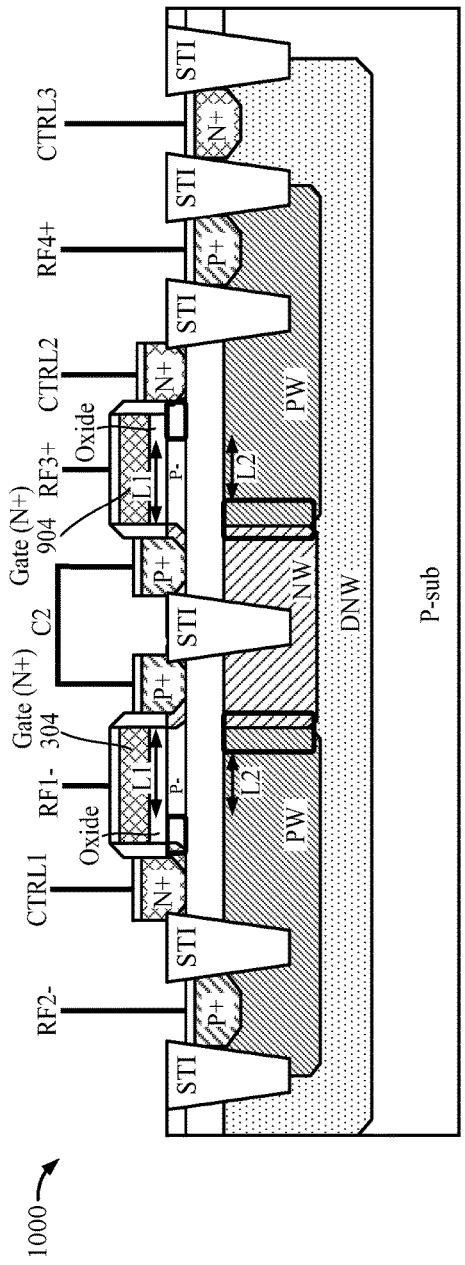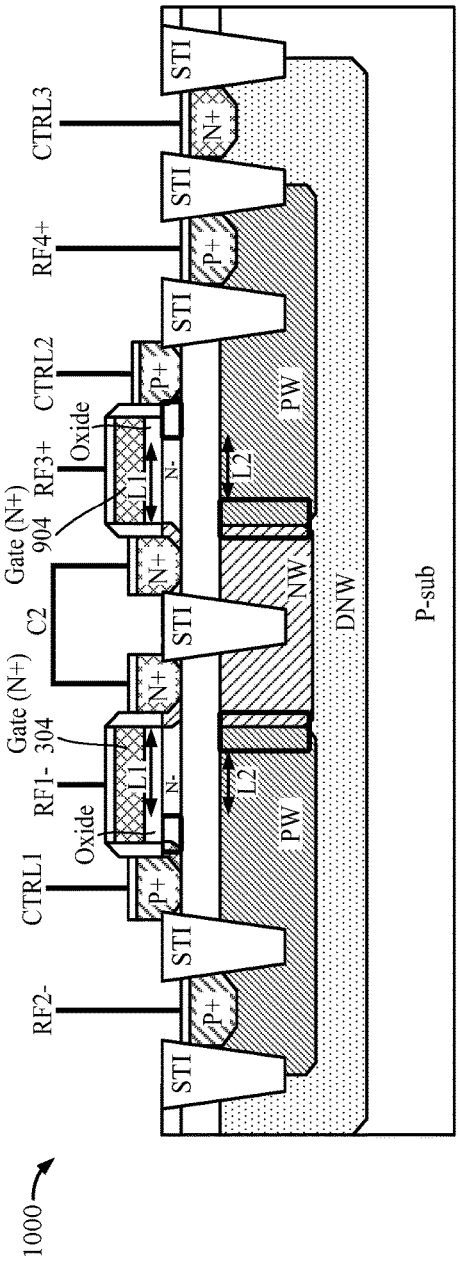
FIG. 10C
FIG. 10D

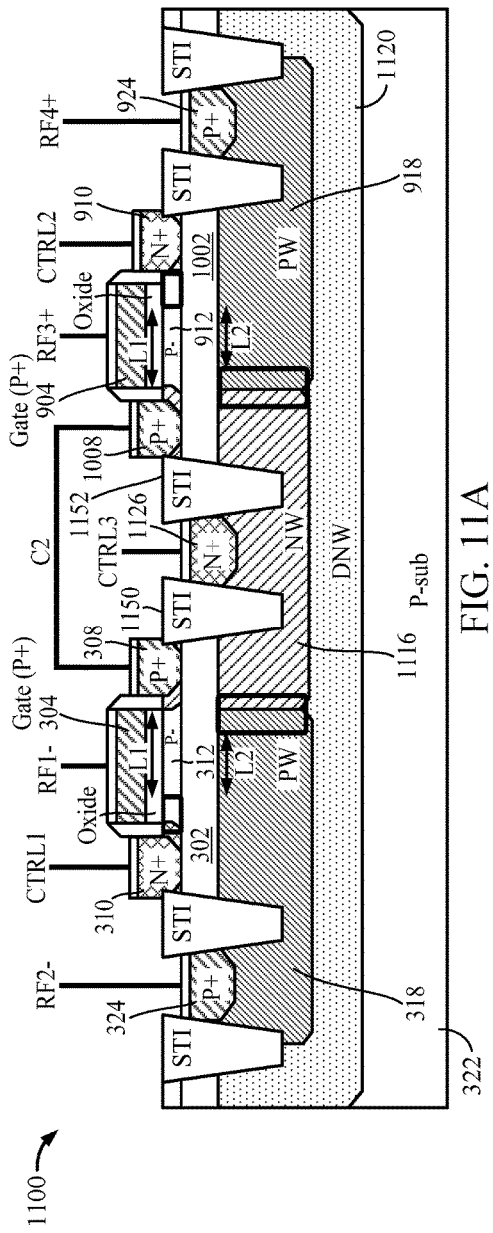
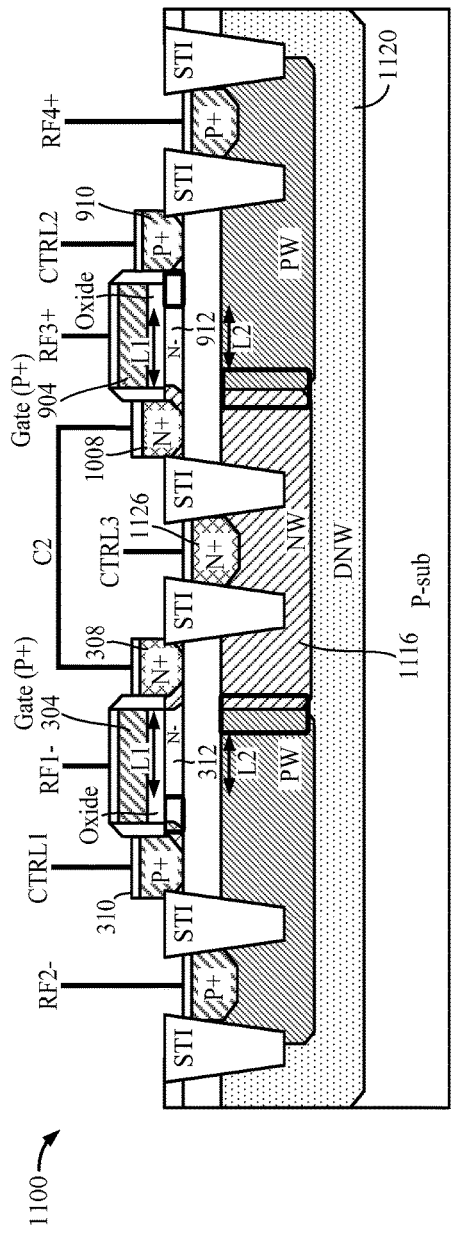
FIG. 11A
FIG. 11B

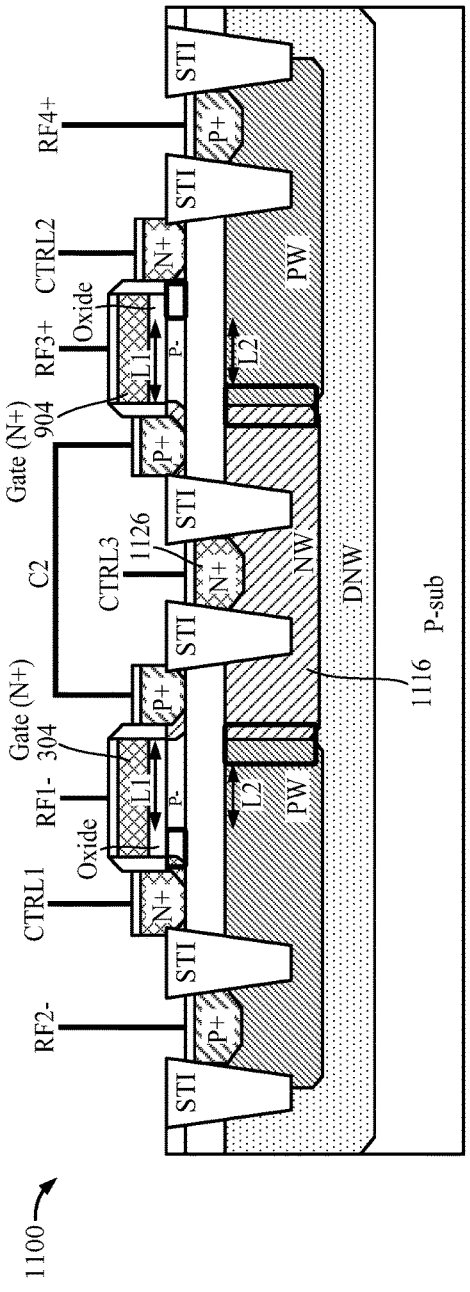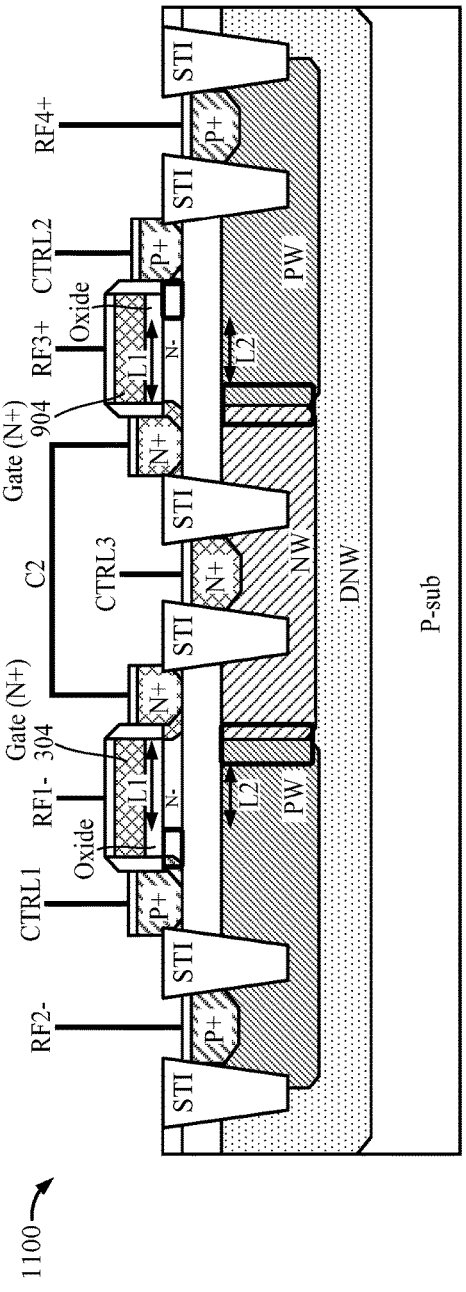
FIG. 11C
FIG. 11D

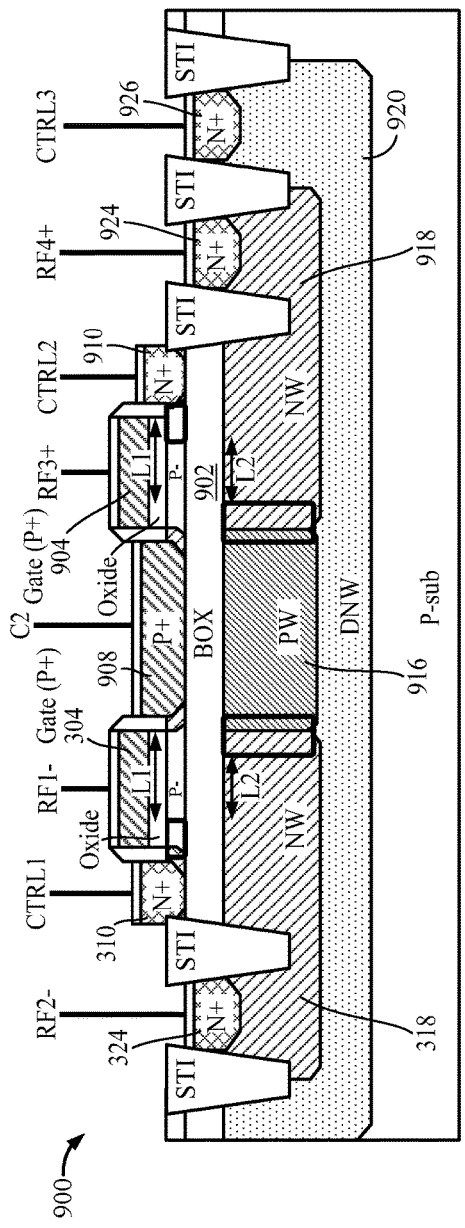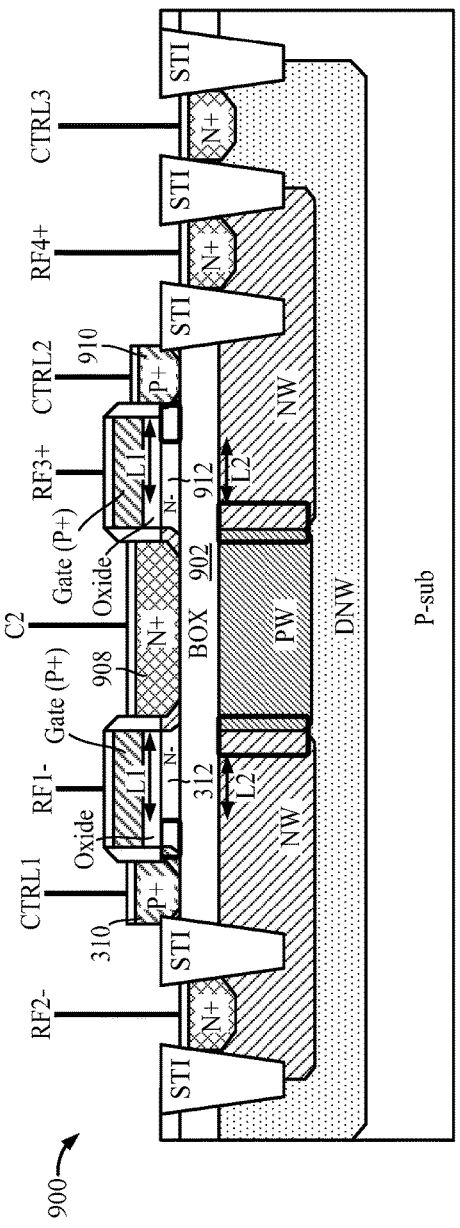
FIG. 12A
FIG. 12B

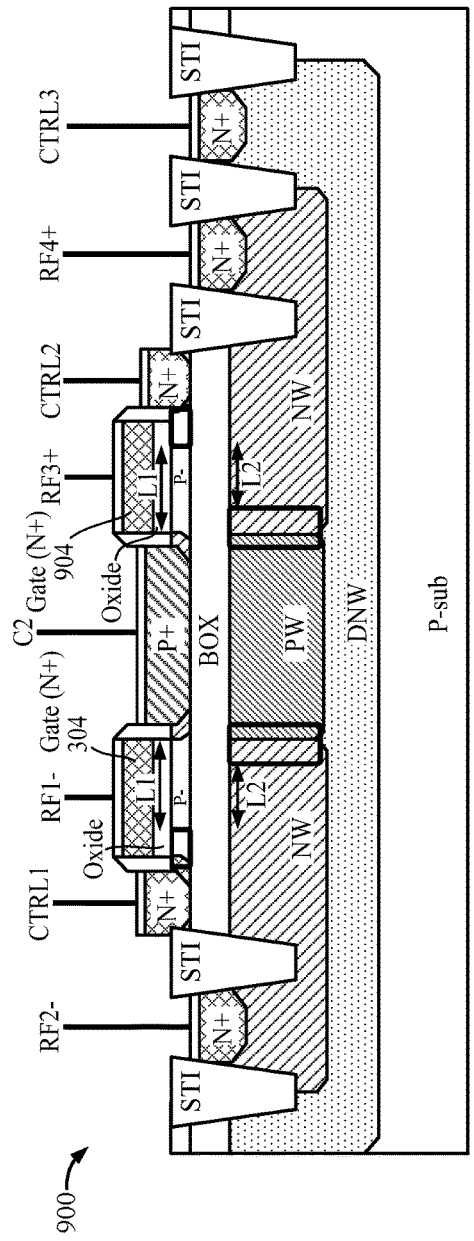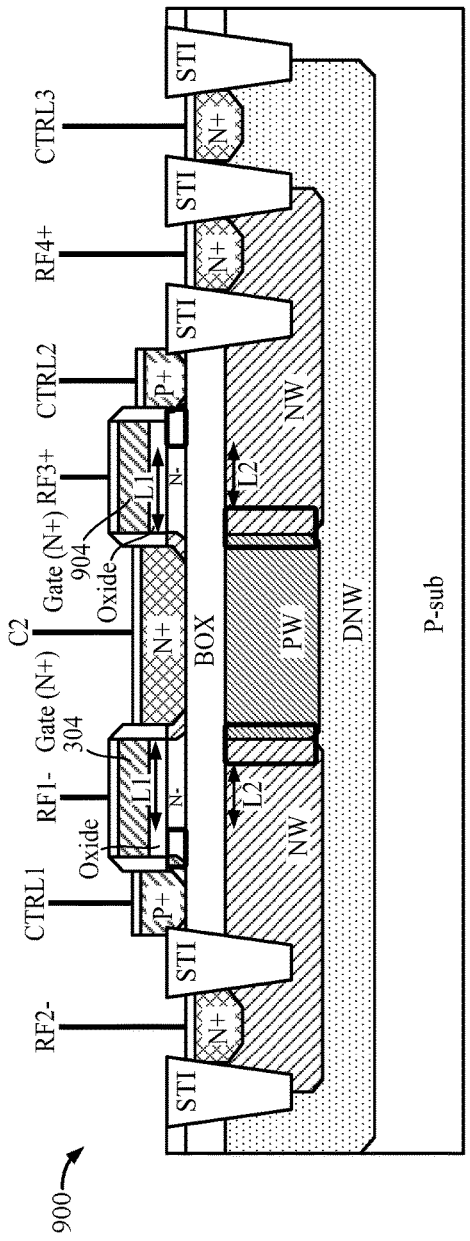
FIG. 12C
FIG. 12D

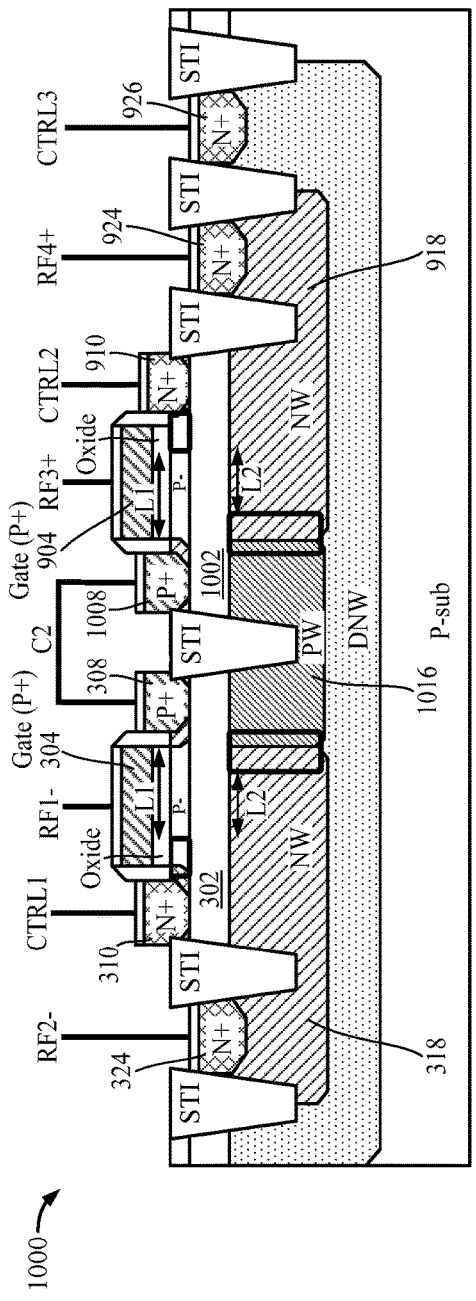
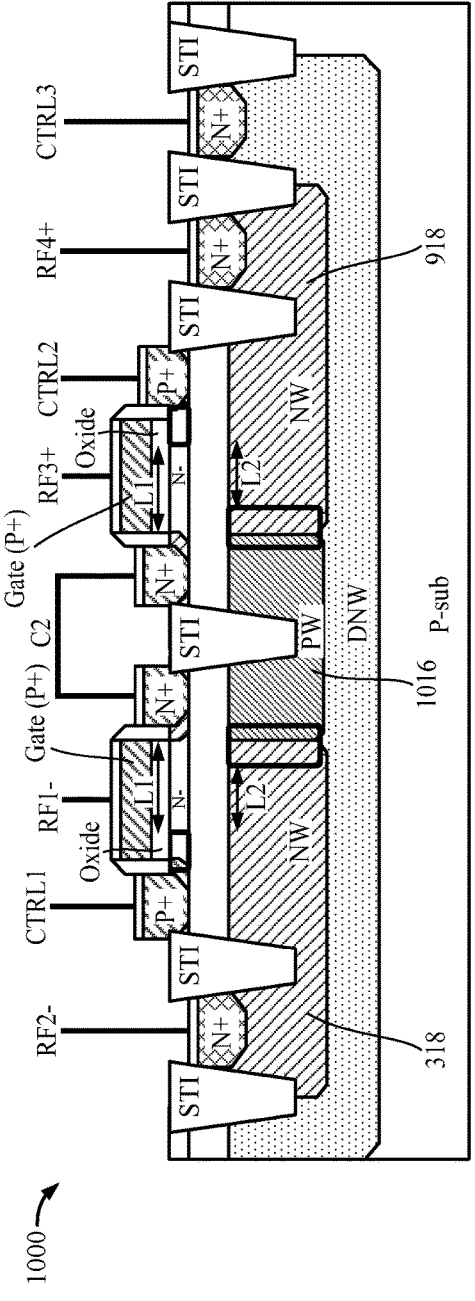
FIG. 13A
FIG. 13B

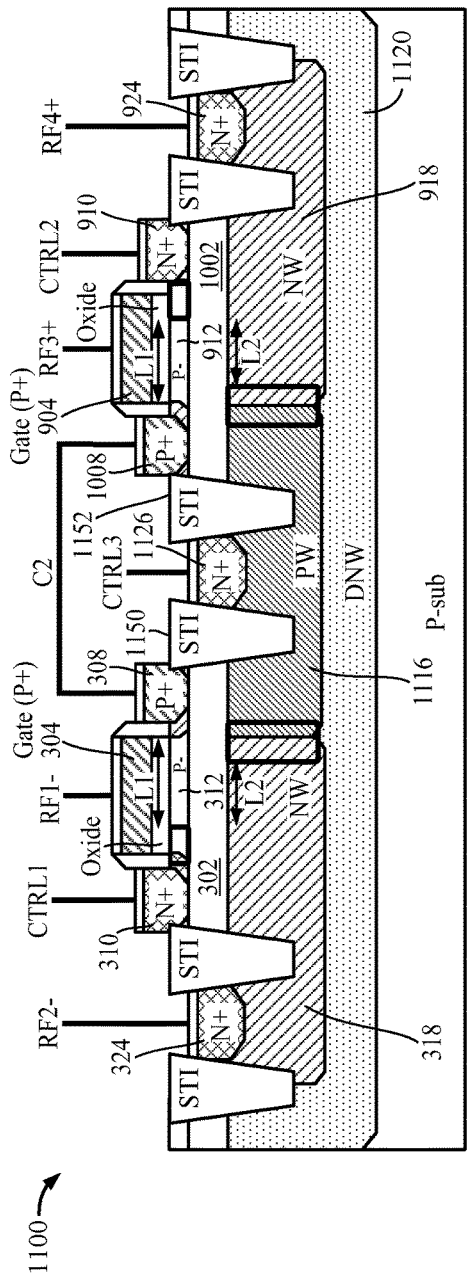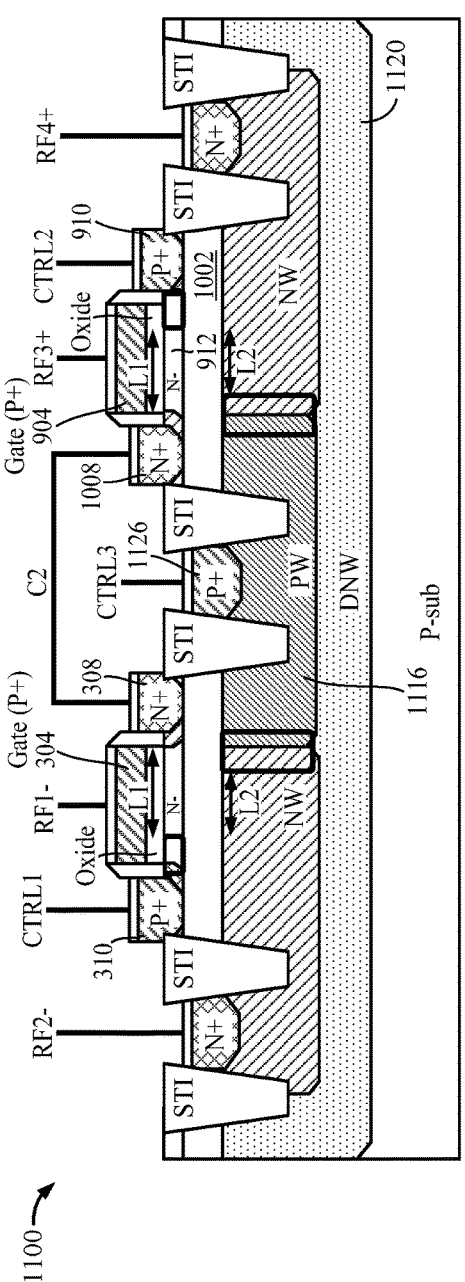
FIG. 14A
FIG. 14B

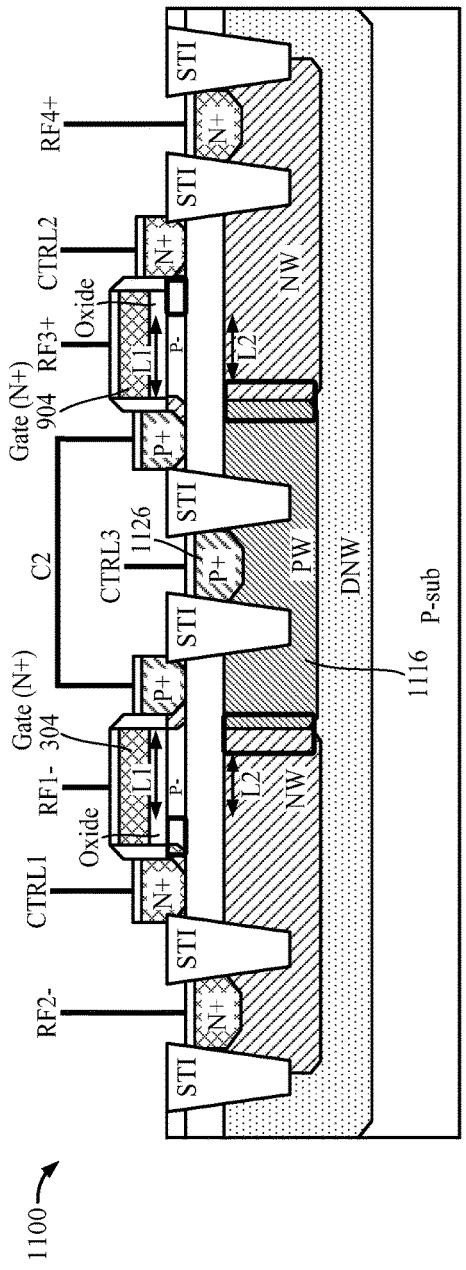
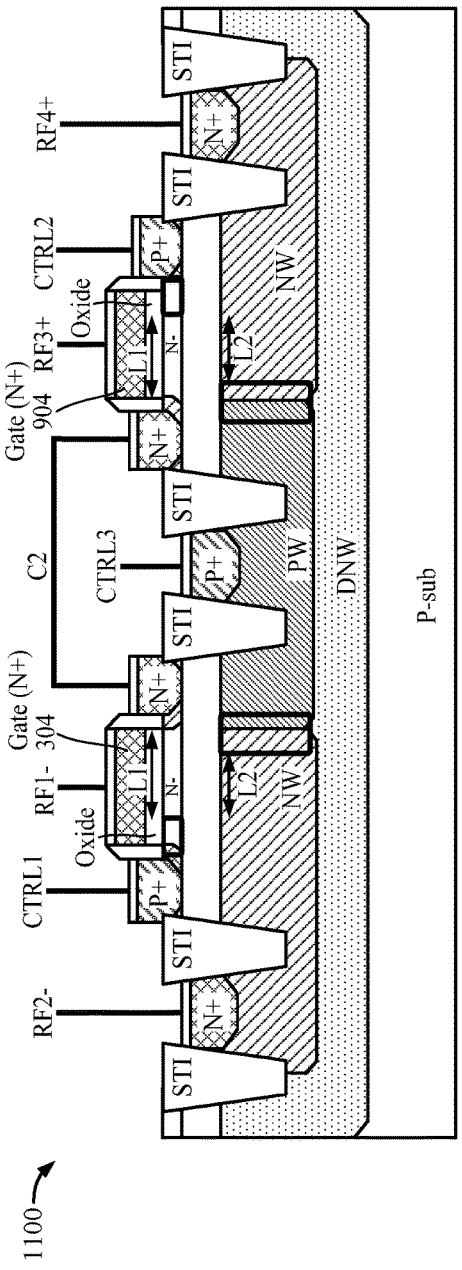
FIG. 14C
FIG. 14D

SILICON ON INSULATOR (SOI) TRANSCAP INTEGRATION PROVIDING FRONT AND BACK GATE CAPACITANCE TUNING

TECHNICAL FIELD

Certain aspects of the present disclosure generally relate to electronic circuits and, more particularly, to variable semiconductor capacitors.

BACKGROUND

A variable capacitor is a capacitor whose capacitance may be altered, for example, due to a control voltage. Also referred to as a varactor, a variable capacitor may be used in any of various applications where there is a desire to adjust a capacitance, such as in inductor-capacitor (LC) circuits to set the resonance frequency of an oscillator (e.g., radio frequency channel tuning) or as a variable reactance (e.g., for impedance matching in antenna tuners).

A voltage-controlled oscillator (VCO) is an example circuit that may use a varactor in which the thickness of a depletion region formed in a p-n junction diode is varied by changing a bias voltage to alter the junction capacitance. Any junction diode exhibits this effect (including p-n junctions in transistors), but devices used as variable capacitance diodes are designed with a large junction area and a doping profile specifically chosen to improve the device performance, such as quality factor and tuning range.

More recently, variable semiconductor capacitor devices have been developed. These devices may also be referred to as transcap (TC) devices. The structure of these devices provides a variable semiconductor capacitor with a metal-oxide semiconductor (MOS)-compatible structure suitable for integrated circuits, which has at least three terminals, one of which is used to modulate the capacitance value between the other two terminals of the device, by increasing or decreasing its DC voltage with respect to one of the main terminals of the device.

SUMMARY

Certain aspects of the present disclosure generally relate to semiconductor variable capacitors having separately tunable front gate and back gate capacitances, as well as techniques for fabricating the same.

Certain aspects of the present disclosure provide a semiconductor variable capacitor. The semiconductor variable capacitor generally includes an insulative layer; a first non-insulative region disposed above the insulative layer; a second non-insulative region disposed above the insulative layer; a first control region disposed above the insulative layer such that a first capacitance between the first non-insulative region and the second non-insulative region is configured to be adjusted by varying a first control voltage applied to the first control region; a first semiconductor region disposed beneath the insulative layer; a second semiconductor region disposed beneath the insulative layer and adjacent to the first semiconductor region, wherein the second semiconductor region comprises a different doping type than the first semiconductor region; a third non-insulative region coupled to the second semiconductor region; and a second control region coupled to the first semiconductor region such that a second capacitance between the third non-insulative region and the second non-insulative region is configured to be adjusted by varying a second control voltage applied to the second control region.

Certain aspects of the present disclosure provide a method for fabricating a semiconductor variable capacitor. The method generally includes forming a first semiconductor region; forming a second semiconductor region adjacent to the first semiconductor region, wherein the second semiconductor region comprises a different doping type than the first semiconductor region; forming an insulative layer above the first semiconductor region and the second semiconductor region; forming a first non-insulative region above the insulative layer; forming a second non-insulative region above the insulative layer; forming a first control region above the insulative layer such that a first capacitance between the first non-insulative region and the second non-insulative region is configured to be adjusted by varying a first control voltage applied to the first control region; forming a third non-insulative region coupled to the second semiconductor region; and forming a second control region coupled to the first semiconductor region such that a second capacitance between the third non-insulative region and the second non-insulative region is configured to be adjusted by varying a second control voltage applied to the second control region.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 9A illustrates a cross-sectional view of example differential p-type gate, p-type channel variable semiconductor capacitors, each with separately tunable front gate and back gate capacitances, the differential capacitors sharing a control region for tuning the back gate capacitances via a deep n-well (DNW), in accordance with certain aspects of the present disclosure.

FIG. 9B illustrates a cross-sectional view of example differential p-type gate, n-type channel variable semiconductor capacitors, each with separately tunable front gate and back gate capacitances, the differential capacitors sharing a control region for tuning the back gate capacitances via a DNW, in accordance with certain aspects of the present disclosure.

FIG. 10A illustrates a cross-sectional view of example differential p-type gate, p-type channel variable semiconductor capacitors, each with separately tunable front gate and back gate capacitances, the differential capacitors sharing a control region for tuning the back gate capacitances via a DNW and having separate buried oxide (BOX) layers separated by a shallow trench isolation (STI) region, in accordance with certain aspects of the present disclosure.

FIG. 10B illustrates a cross-sectional view of example differential p-type gate, n-type channel variable semiconductor capacitors, each with separately tunable front gate and back gate capacitances, the differential capacitors sharing a control region for tuning the back gate capacitances via a DNW and having separate BOX layers separated by an STI region, in accordance with certain aspects of the present disclosure.

FIG. 10C illustrates a cross-sectional view of example differential n-type gate, p-type channel variable semiconductor capacitors, each with separately tunable front gate and back gate capacitances, the differential capacitors sharing a control region for tuning the back gate capacitances via a DNW and having separate BOX layers separated by an STI region, in accordance with certain aspects of the present disclosure.

FIG. 10D illustrates a cross-sectional view of example differential n-type gate, n-type channel variable semiconductor capacitors, each with separately tunable front gate and back gate capacitances, the differential capacitors sharing a control region for tuning the back gate capacitances via a DNW and having separate BOX layers separated by an STI region, in accordance with certain aspects of the present disclosure.

FIG. 11A illustrates a cross-sectional view of example differential p-type gate, p-type channel variable semiconductor capacitors, each with separately tunable front gate and back gate capacitances, the differential capacitors sharing a control region for tuning the back gate capacitances and having separate BOX layers separated by STI regions bounding the shared control region, in accordance with certain aspects of the present disclosure.

FIG. 11B illustrates a cross-sectional view of example differential p-type gate, n-type channel variable semiconductor capacitors, each with separately tunable front gate and back gate capacitances, the differential capacitors sharing a control region for tuning the back gate capacitances and having separate BOX layers separated by STI regions bounding the shared control region, in accordance with certain aspects of the present disclosure.

FIG. 11C illustrates a cross-sectional view of example differential n-type gate, p-type channel variable semiconductor capacitors, each with separately tunable front gate and back gate capacitances, the differential capacitors sharing a control region for tuning the back gate capacitances and having separate BOX layers separated by STI regions bounding the shared control region, in accordance with certain aspects of the present disclosure.

FIG. 11D illustrates a cross-sectional view of example differential n-type gate, n-type channel variable semiconductor capacitors, each with separately tunable front gate and back gate capacitances, the differential capacitors sharing a control region for tuning the back gate capacitances and having separate BOX layers separated by STI regions bounding the shared control region, in accordance with certain aspects of the present disclosure.

FIGS. 12A-12D illustrate cross-sectional views of example differential variable semiconductor capacitors similar to FIGS. 9A-9D, respectively, but with the back gate channels disposed in NWs, rather than in PWs, in accordance with certain aspects of the present disclosure.

FIGS. 13A-13D illustrate cross-sectional views of example differential variable semiconductor capacitors similar to FIGS. 10A-10D, respectively, but with the back gate channels disposed in NWs, rather than in PWs, in accordance with certain aspects of the present disclosure.

FIGS. 14A-14D illustrate cross-sectional views of example differential variable semiconductor capacitors similar to FIGS. 11A-11D, respectively, but with the back gate channels disposed in NWs, rather than in PWs, in accordance with certain aspects of the present disclosure.

DETAILED DESCRIPTION

Certain aspects of the present disclosure are generally directed to semiconductor variable capacitor devices, also referred to as transcap (TC) devices, suitable for integrated circuits. A TC device may have at least three terminals, where the capacitance between two main terminals of the device (C1 and C2) can be varied by changing a voltage applied between a control terminal (CTRL) and one of the other two main terminals (e.g., C2). Certain aspects of the present disclosure provide various semiconductor variable capacitors having separately tunable front gate and back gate capacitances in an effort to improve the capacitance resolution. The front gate of the semiconductor variable capacitor may be used for coarse tuning, whereas the back gate may be used for fine tuning.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Transcap Device

Figure 1:
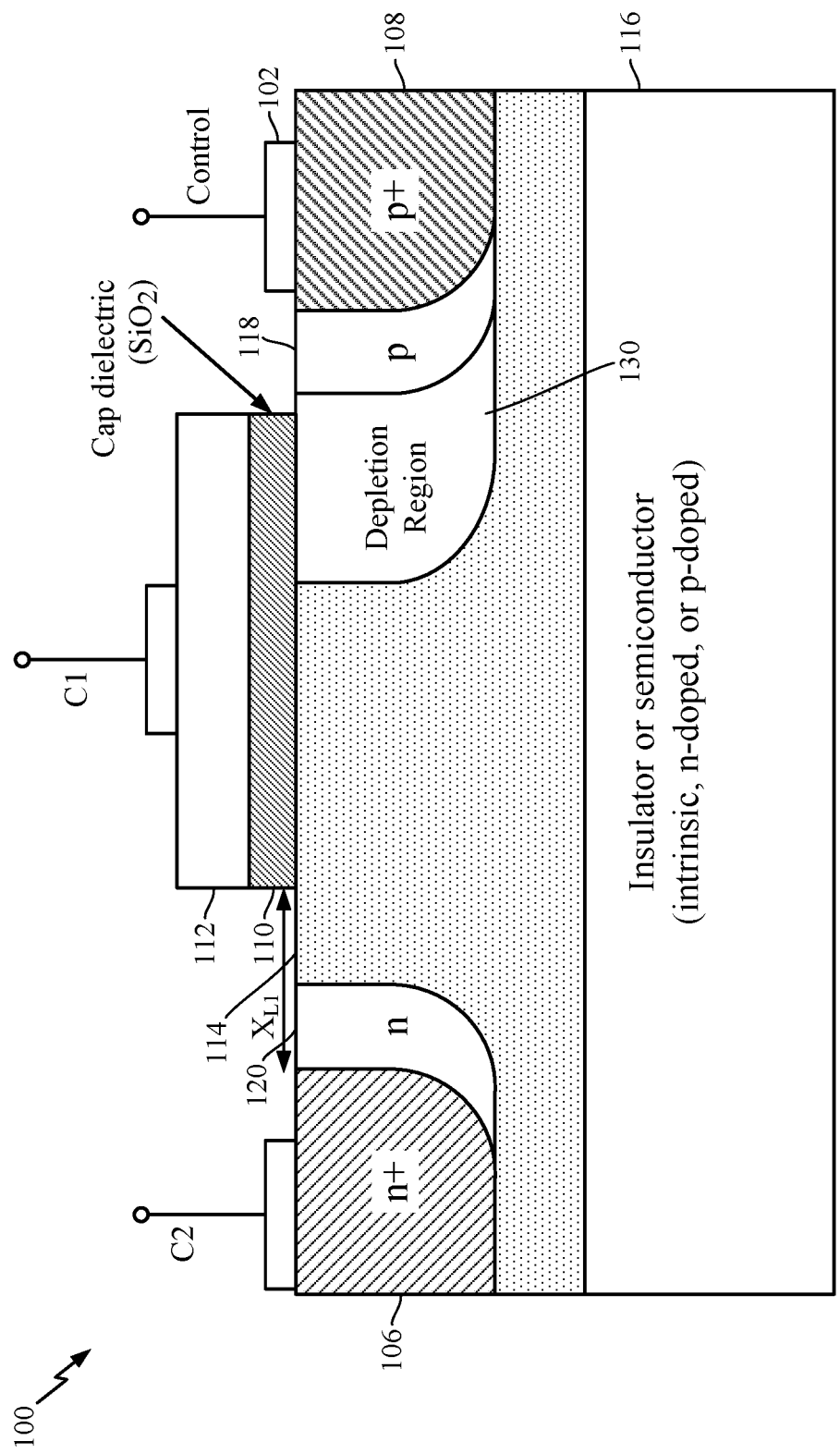
FIG. 1 illustrates a cross-sectional view of an example variable semiconductor capacitor.

FIG. 1 illustrates a cross-sectional view of an example structure of a transcap (TC) device 100. Certain implementations of a TC device use an oxide layer 110, which may be similar to oxide gate layers used to fabricate metal-oxide semiconductor (MOS) devices (e.g., thin or thick gate oxide). The oxide layer 110 may isolate the C1 and C2 terminals and thus in effect act as a dielectric for the TC device 100. A non-insulative region 106 (e.g., an n+ implantation region) and a non-insulative region 108 (e.g., a p+ implantation region) may be formed on the two sides of the TC device 100 in order to create p-n junctions. As used herein, a non-insulative region generally refers to a region that may be electrically conductive or semiconductive. A bias voltage may be applied between the control terminal 102 and the C2 terminal in order to modulate the capacitance between terminals C1 and C2 (across the oxide layer 110). For example, by applying a bias voltage to the control terminal 102, a depletion region 130 may be formed at the p-n junction between the non-insulative region 108 (e.g., control region) and a semiconductor region, which may implemented using an n-well (NW) region 114. Based on the bias voltage, this depletion region 130 may widen under the oxide layer 110, reducing the area of the equivalent electrode formed by the NW region 114, and thus, the effective capacitance area and capacitance value of the TC device 100.

The work-function of a non-insulative region 112 above the oxide layer 110 may be chosen to improve the device performance. For example, an n-doped poly-silicon material may be used (instead of p-doped), even if the NW region 114 underneath the oxide layer 110 is doped with n-type impurities. In some aspects, a metallic material (also doped if desired) with an opportune work-function or a multi-layer stack of different metallic materials may be used for the non-insulative region 112, so as to obtain the desired work-function. In certain aspects, the non-insulative region 112 may be divided into two sub-regions (e.g., one n-doped and one p-doped), or a different metallic material may be used for each sub-region.

In some cases, the NW region 114 may be disposed above a non-conductive region 116 (e.g., an insulator or semiconductor). As used herein, a non-conductive region generally refers to a region that may be electrically insulative or semiconductive. The type of material for the non-conductive region 116 may be chosen in order to improve the performance of the TC device 100. For example, the non-conductive region 116 may be an insulator, a semi-insulator, or an intrinsic/near-intrinsic semiconductor in order to decrease the parasitic capacitances associated with the substrate (not shown). In some cases, the non-conductive region 116 can be made of n-doped or p-doped semiconductor with an appropriate doping profile in order to increase the TC device quality factor and/or the control on the depletion region 130 that may be formed between the non-insulative region 108 and the NW region 114 when applying a bias voltage to the control terminal 102. The non-conductive region 116 can also be formed by multiple semiconductor layers or regions doped in different ways (n, p, or intrinsic). Furthermore, the non-conductive region 116 can include semiconductors, insulating layers, and/or substrates or can be formed above semiconductors, insulating layers, and/or substrates.

To better understand the working principle of the TC device 100, it may be assumed that the control terminal 102 is biased with a negative voltage with respect to the C2 terminal, for example. The width of the depletion region 130 in the NW region 114 may be controlled by applying a control voltage to the control terminal 102. The capacitance between the C1 and C2 terminals may depend on the dimensions of the depletion region 130 in the NW region 114, and thus, can be controlled by applying the control voltage to the control terminal 102. Furthermore, the variation of the bias voltage applied to the control terminal 102 may not alter the DC voltage between the C1 and C2 terminals, allowing for improved control of the device characteristics. If a voltage applied to the C1 terminal is half of a voltage applied to the C2 terminal, the voltage difference between the C2 and C1 terminals (or between the C1 terminal and the control terminal 102) may be reduced. The higher voltage of the C2 terminal (e.g., about twice the breakdown voltage of the C1 terminal to the control terminal) allows for an increase in the capacitance range for the TC device 100.

In some cases, it may be preferable to locate the non-insulative region 106 and/or the non-insulative region 108 away from the oxide layer 110 in order to reduce the parasitic capacitance associated with the non-insulative region 108 and increase the isolation of the non-insulative region 106 for high control voltages. For example, the non-insulative region 106 can be partially overlapped by the oxide layer 110, or the non-insulative region 106 can be formed at a distance from the edge of the oxide layer 110 so as to increase the device tuning range and linearity. In the latter case, the voltage-withstanding capability of the device is increased since a portion of a radio frequency (RF) signal, which may be applied to the C1 and C2 terminals, drops between the oxide edge and the non-insulative region 106 instead of being applied entirely across the oxide layer 110. The non-insulative region 108 can be partially overlapped by the oxide layer 110, or the non-insulative region 108 can be spaced apart therefrom so as to reduce the parasitic capacitance between the C1 terminal and the control terminal 102.

A p-doped region 118 can be optionally used to increase the breakdown voltage of the p-n junction between the non-insulative region 108 and the NW region 114, at the same time decreasing the parasitic capacitance between the C1 terminal and the control terminal 102. Similarly, an optional n-doped region 120 can be added between the non-insulative region 106 and the NW region 114 in order to regulate the doping concentration between the oxide layer 110 and the non-insulative region 106.

Figure 2:
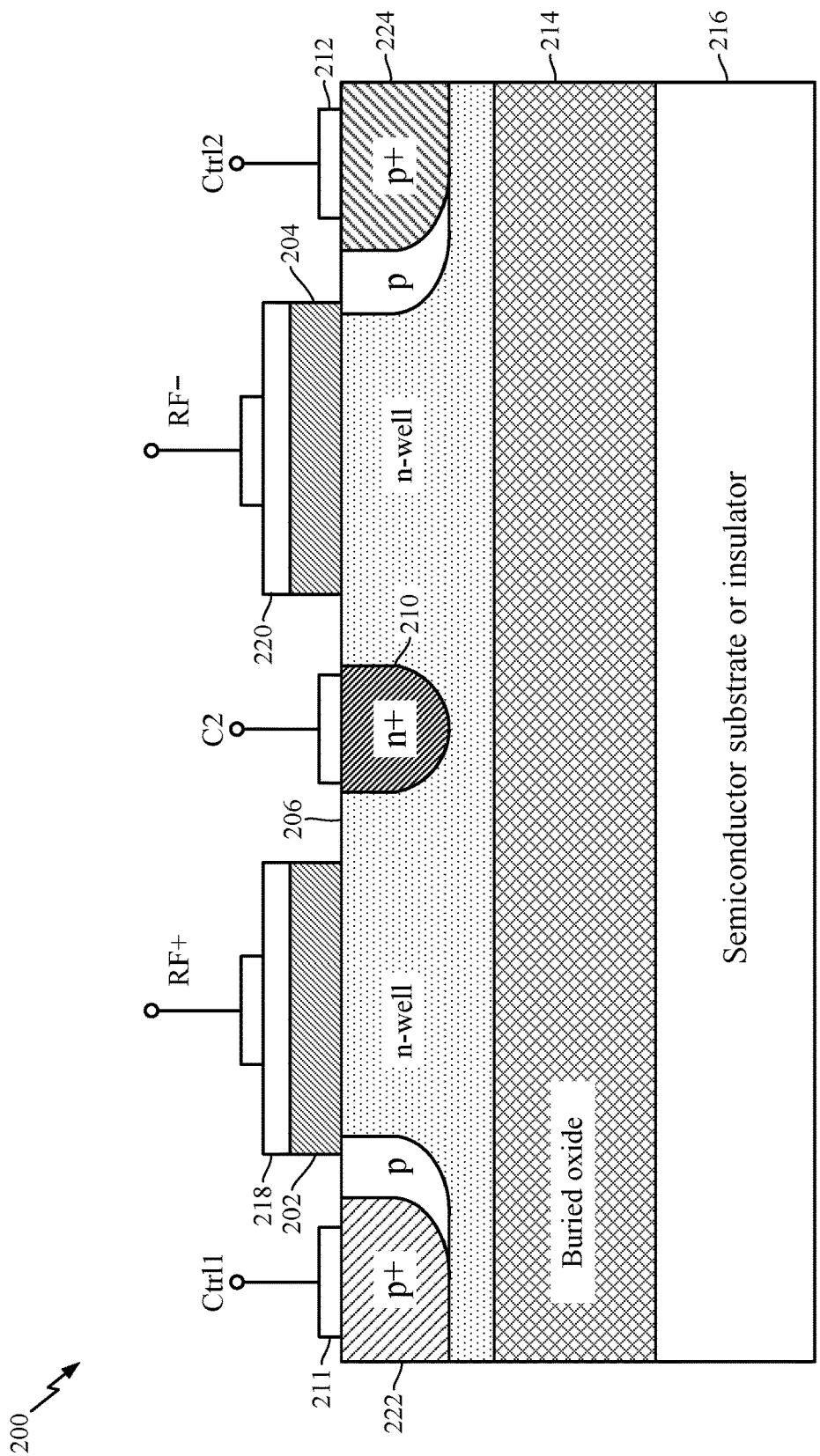
FIG. 2 illustrates a cross-sectional view of example differential variable semiconductor capacitors.

FIG. 2 illustrates an example differential TC device 200 in cross-section. The differential TC device 200 can be obtained by disposing two of the TC devices 100 back-to-back. In this example, RF+ and RF− terminals (e.g., corresponding to the C1 terminal in FIG. 1) correspond to the positive and negative nodes of a differential RF port for a differential RF signal. The RF+ terminal may be disposed on an oxide layer 202, and the RF− terminal may be disposed on an oxide layer 204 (both layers 202, 204 analogous to the oxide layer 110). A shared n-well region 206 (analogous to the NW region 114) may be coupled to a C2 terminal via a non-insulative region 210 (e.g., with n+ doping), as illustrated. A bias voltage may be applied to the control terminals 211 and 212 (or to the C2 terminal with respect to the other terminals of the device) to adjust depletion regions of the n-well region 206, thereby adjusting the capacitance between respective RF+ and RF− terminals and the C2 terminal. In some aspects, as illustrated in FIG. 2, a buried oxide layer 214 may be positioned below the n-well region 206 and above a non-conductive region 216 (analogous to the non-conductive region 116). The buried oxide layer 214 may be composed of a semiconductor substrate or insulator, for example.

Example SOI Transcap Devices with Coarse and Fine Capacitance Tuning

As described above, a transcap is a semiconductor variable capacitor with three or more terminals, wherein the capacitance between the two main terminals (C1 and C2) can be varied by changing the direct current (DC) voltage applied between a control terminal (CTRL) and one of the other two main terminals. Transcaps are typically fabricated as silicon on insulator (SOI) devices and are analog-technology oriented. Bulk transcaps may entail a deep trench (e.g., >10 μm). Transcaps may have special n-type (4-10 μm) or p-type (1-2 μm) buried layers and a deep high-voltage n-well (HVNW) (~4 μm) or p-well (HVPW) (2 μm) for isolation. Conventionally for transcaps, the retrograde well surface dopant concentration may be low, and the series resistance may be high, which affects the quality factor (Q) value of the transcaps. Currently, the transcap fabrication process is complex and incompatible with complementary metal-oxide semiconductor (CMOS) fabrication processes. Moreover, the radio frequency (RF) signal path may have high DC voltage. Furthermore, conventional transcaps have the capability of tuning only one type of capacitance (e.g., coarse capacitance adjustment, with no fine tune adjustment). With a coarse capacitance adjustment, one may be not be able to achieve the desired capacitance value and may thus have to tolerate a value that is above or below the desired value.

Certain aspects of the present disclosure provide a transcap with at least two types of capacitance tuning, and techniques for fabricating the same. For example, a CMOS-compatible SOI process with a buried oxide (BOX) layer may provide a transcap with a front gate (above the BOX layer) and a back gate (beneath the BOX layer). The front gate may offer lower voltage, coarse capacitance tuning, whereas the back gate may offer higher voltage, fine capacitance tuning. By offering both types of capacitance tuning, such transcaps may provide greater capacitance resolution and potentially a larger tuning range. There are several variations of transcaps with front gate and back gate tuning, some of which are described below.

Figure 3A:
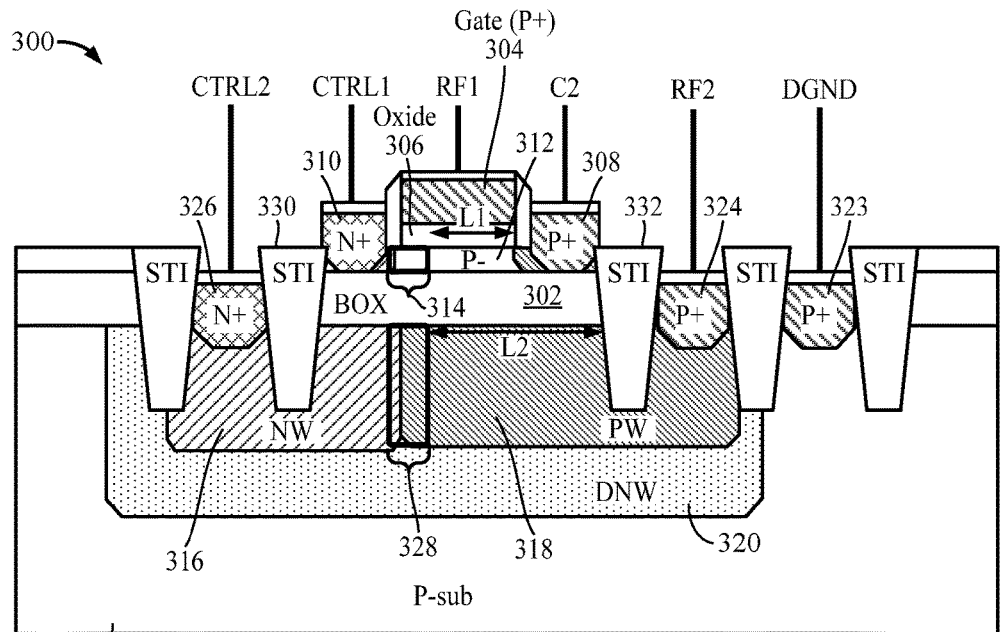
FIG. 3A illustrates a cross-sectional view of an example p-type gate, p-type channel variable semiconductor capacitor with separately tunable front gate and back gate capacitances, in accordance with certain aspects of the present disclosure.

FIG. 3A illustrates a cross-sectional view of an example transcap structure 300 with separately tunable front gate and back gate capacitances, in accordance with certain aspects of the present disclosure. The transcap structure 300 may include an insulative layer 302 (e.g., a buried oxide (BOX) layer). The insulative layer 302 may be compatible with silicon on insulator (SOI) fabrication processes (e.g., CMOS fully depleted SOI (FDSOI) processes).

A non-insulative region 304 (e.g., a gate, analogous to the non-insulative region 112 of FIG. 1) may be disposed above an oxide layer 306 (analogous to the oxide layer 110). Although the non-insulative region 304 is doped p+ in FIG. 3A, the non-insulative region 304 may alternatively be doped n+, as depicted in other aspects provided herein. Using p+ or n+ doping for the non-insulative region 304 in p-type or n-type channel transcap devices may reduce gate depletion. The non-insulative region 304 may be coupled to a signal terminal labeled "RF1," as shown. A non-insulative region 308 (analogous to the non-insulative region 106 of FIG. 1) may be disposed above the insulative layer 302. Although the non-insulative region 308 is doped p+ in FIG. 3A, the non-insulative region 308 may alternatively be doped n+, as portrayed in other aspects provided herein. The non-insulative region 308 may be coupled to a signal terminal labeled "C2," as shown. A control region 310 (a non-insulative region, analogous to the non-insulative region 108 of FIG. 1) may be disposed above the insulative layer 302. Although the control region 310 is doped n+ in FIG. 3A, the control region 310 may alternatively be doped p+, as portrayed in other aspects provided herein. The control region 310 may be coupled to a control terminal labeled "CTRL1," as shown. The control region 310 may have a different doping type than the non-insulative region 308.

The transcap structure 300 may also include a threshold voltage (Vt) implant region 312 interposed between the non-insulative region 304 (and more specifically, the oxide layer 306) and the insulative layer 302 (i.e., disposed below the non-insulative region 304 and above the insulative layer 302). The Vt implant region may improve the quality factor (Q) of the front gate capacitor and/or decrease the series resistance. Although the Vt implant region 312 is doped p− in FIG. 3A, the Vt implant region may alternatively be doped n−, as portrayed in other aspects provided herein. The Vt implant region 312 may have the same doping type as the non-insulative region 308 (e.g., both p-doped as illustrated in FIG. 3A). For certain aspects, the Vt implant region 312 may be doped with any of various suitable dopants or implants (e.g., B or BF2).

In operation, a control voltage applied to the CTRL1 terminal (with respect to either the RF1 or the C2 terminal) may be used to adjust the capacitance between the non-insulative region 304 and the non-insulative region 308, across the oxide layer 306. Adjusting the applied control voltage changes the width of the depletion region 314 in the Vt implant region 312, which varies the effective length of the channel (L1), adjusting the effective area for the front gate capacitor and, hence, the capacitance.

The transcap structure 300 may also include a semiconductor region 316 disposed beneath the insulative layer 302. The semiconductor region 316 may be a retrograde n-well (NW) region as illustrated in FIG. 3A, but may also be a p-well (PW) region as depicted in other aspects provided herein. A semiconductor region 318 may be disposed beneath the insulative layer 302 and adjacent to the semiconductor region 316. The semiconductor region 318 may be a PW region as shown in FIG. 3A, but may also be an NW region as portrayed in other aspects provided herein. The semiconductor regions 316 and 318 may have different doping types.

For certain aspects, a semiconductor region 320 (e.g., a deep n-well (DNW) region) may be disposed beneath the semiconductor regions 316 and 318. A substrate layer 322 (e.g., a p-type substrate (labeled "P-sub") as illustrated) may be disposed below the semiconductor region 320. The substrate layer 322 may have a different doping type than the semiconductor region 320. The substrate layer 322 may be coupled to a reference potential terminal (e.g., digital ground, labeled "DGND") via a non-insulative region 323.

The semiconductor region 318 may be coupled to a non-insulative region 324. Although the non-insulative region 324 is doped p+ in FIG. 3A, the non-insulative region 324 may alternatively be doped n+, as depicted in other aspects provided herein. The non-insulative region 324 may be coupled to a signal terminal labeled "RF2," as shown. RF2 may be the same signal as, or a different signal from, RF1. The semiconductor region 316 may be coupled to a control region 326 (a non-insulative region). Although the control region 326 is doped n+ in FIG. 3A, the control region 326 may alternatively be doped p+, as portrayed in other aspects provided herein. The control region 326 may be coupled to a control terminal labeled "CTRL2," as shown. The control region 326 may have a different doping type than the non-insulative region 324.

In operation, a control voltage applied to the CTRL2 terminal (with respect to either the RF2 or the C2 terminal) may be used to adjust the capacitance between the non-insulative region 324 and the non-insulative region 308, across the insulative layer 302. Adjusting the applied control voltage changes the width of the depletion region 328 at the p-n junction between the semiconductor regions 316, 318, which varies the effective length of the back gate (L2), adjusting the effective area for the back gate capacitor and, hence, the capacitance.

The back gate capacitance may offer fine tuning adjustment, whereas the front gate capacitance may offer coarse tuning adjustment. The insulative layer 302 may have a significantly greater thickness than that of the oxide layer 306. Thus, higher control voltages may be applied to the CTRL2 terminal for adjusting the back gate capacitance than to the CTRL1 terminal for adjusting the front gate capacitance. For certain aspects, RF1 and RF2 may be the same signal (e.g., the RF1 and RF2 terminals may be shorted together, such that the non-insulative region 324 is electrically coupled to the non-insulative region 304). In this case, the front gate capacitance and the back gate capacitance are in parallel, and their capacitance values are effectively summed. For other aspects, RF1 and RF2 may be different signals.

For certain aspects, a shallow trench isolation (STI) region 330 may be disposed between the insulative layer 302 and the control region 326. Thus, the STI region 330 may separate the control region 326 from the control region 310, as shown in FIG. 3A. The STI region 330 may also be disposed above at least a portion of the semiconductor region 316. The semiconductor region 316 may be electrically coupled to the control region 326.

For certain aspects, an STI region 332 may be disposed between the insulative layer 302 and the non-insulative region 324. Thus, the STI region 332 may isolate the non-insulative region 324 from the non-insulative region 308, as illustrated in FIG. 3A. The STI region 332 may also be disposed above at least a portion of the semiconductor region 318. The semiconductor region 318 may be electrically coupled to the control region 326.

Figure 3B:
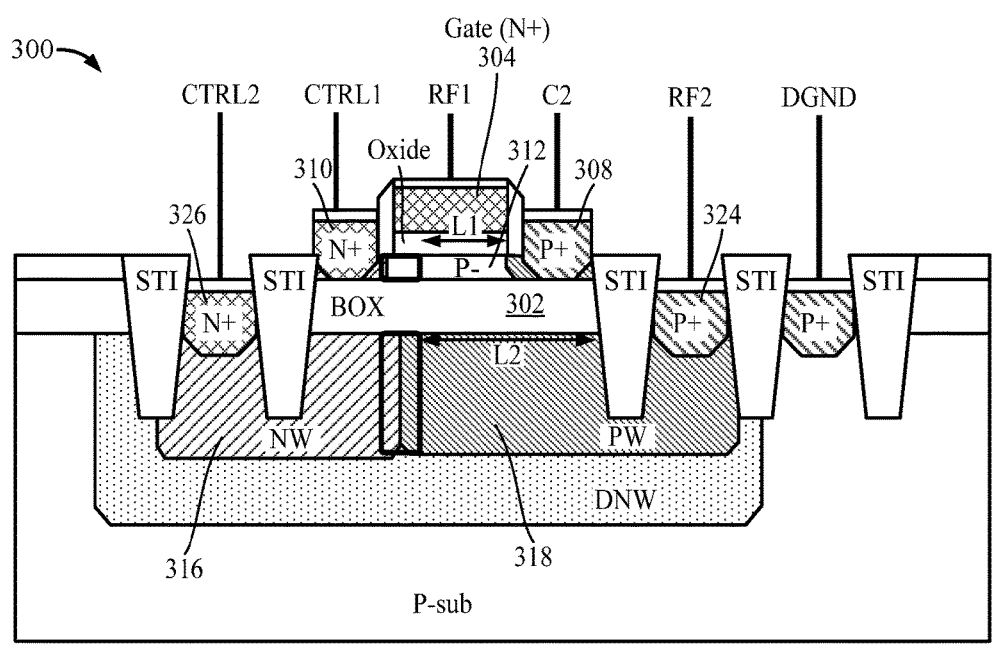
FIG. 3B illustrates a cross-sectional view of an example n-type gate, p-type channel variable semiconductor capacitor with separately tunable front gate and back gate capacitances, in accordance with certain aspects of the present disclosure.

FIG. 3B illustrates the transcap structure 300 of FIG. 3A, but with the non-insulative region 304 being doped n+ instead of p+, in accordance with certain aspects of the present disclosure. Thus, the transcap structure 300 of FIG. 3B may be referred to as an n-type gate, p-type channel transcap.

Figure 4A:
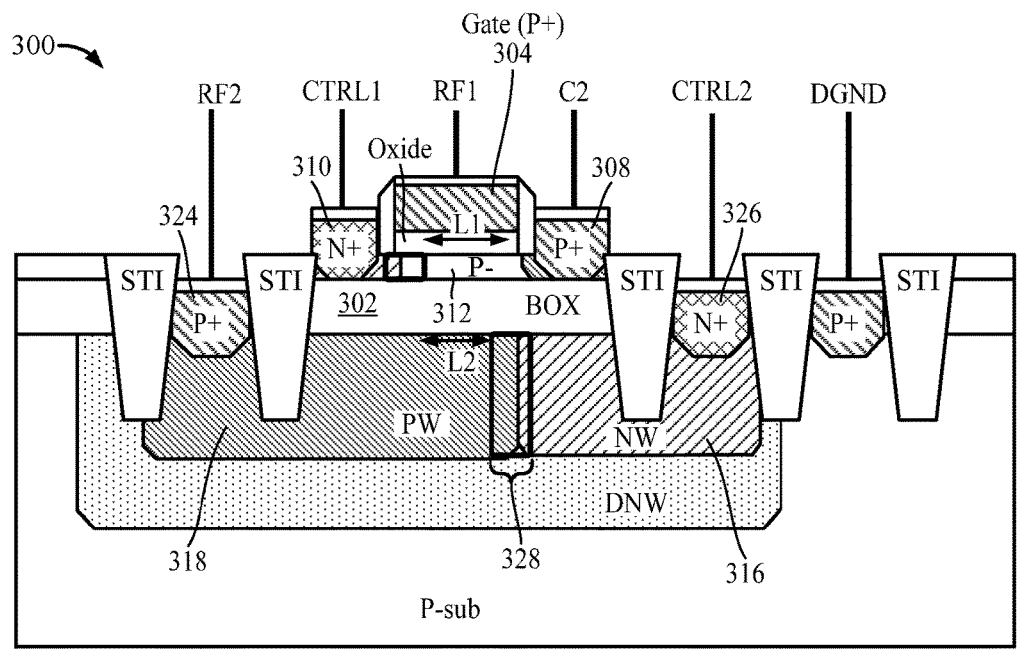
FIG. 4A illustrates a cross-sectional view of an example p-type gate, p-type channel variable semiconductor capacitor with separately tunable front gate and back gate capacitances, with a shorter back gate channel length than in FIG. 3A, in accordance with certain aspects of the present disclosure.

FIG. 4A illustrates the transcap structure 300 of FIG. 3A, but with a shorter back gate length (L2), in accordance with certain aspects of the present disclosure. In FIG. 4A, the semiconductor region 316 and the control region 326 electrically coupled thereto have been exchanged with the semiconductor region 318 and the non-insulative region 324 electrically coupled thereto. At least a portion of the depletion region 328 between the semiconductor regions 316, 318 in FIG. 4A is disposed underneath an area between the non-insulative regions 304, 308, rather than underneath an area between the non-insulative region 304 and the control region 310 as in FIG. 3A. In other words, the depletion region 328 in FIG. 4A is closer to the non-insulative region 308, whereas the depletion region 328 in FIG. 3A is closer to the control region 310. In this manner, the back gate length (L2) in FIG. 4A has been shortened compared to L2 in FIG. 3A, and this shorter L2 may provide increased sensitivity for the fine back gate capacitance adjustment.

Figure 4B:
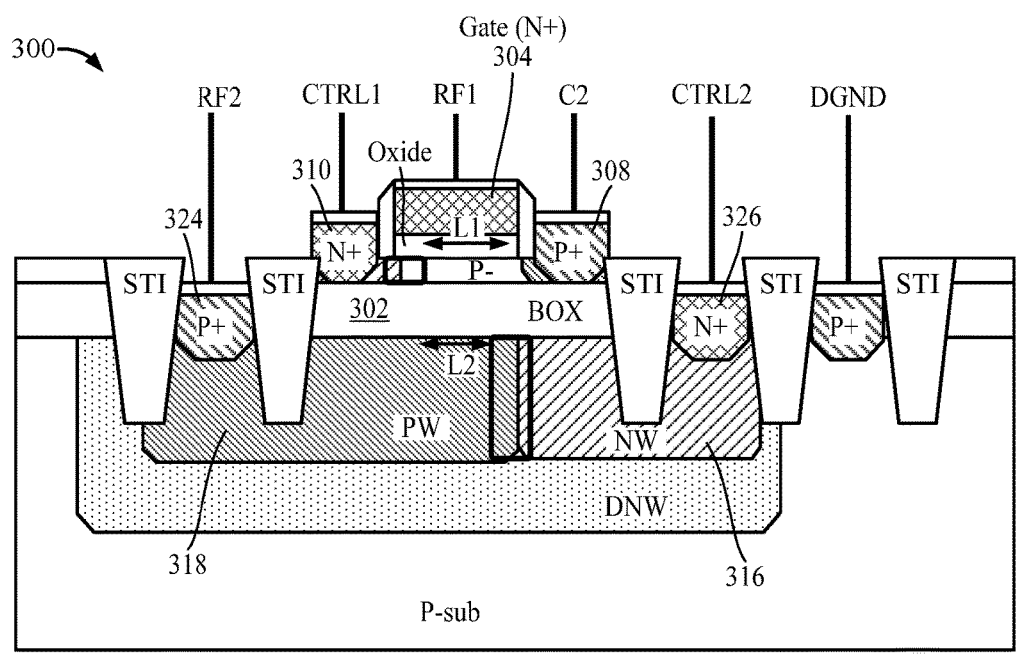
FIG. 4B illustrates a cross-sectional view of an example n-type gate, p-type channel variable semiconductor capacitor with separately tunable front gate and back gate capacitances, with a shorter back gate channel length than in FIG. 3B, in accordance with certain aspects of the present disclosure.

FIG. 4B illustrates the transcap structure 300 of FIG. 4A, but with the non-insulative region 304 being doped n+ instead of p+, in accordance with certain aspects of the present disclosure. Thus, the transcap structure 300 of FIG. 4B may be referred to as an n-type gate, p-type channel transcap.

Figure 5A:
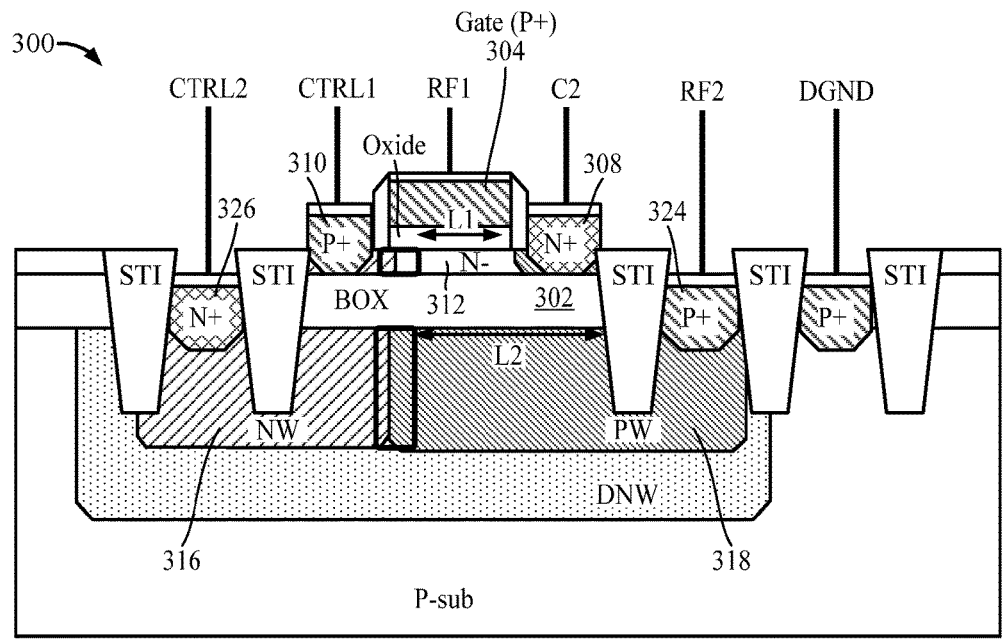
FIG. 5A illustrates a cross-sectional view of an example p-type gate, n-type channel variable semiconductor capacitor with separately tunable front gate and back gate capacitances, in accordance with certain aspects of the present disclosure.

FIG. 5A illustrates the transcap structure 300 of FIG. 3A, but with the non-insulative region 308 being doped n+ instead of p+, the control region 310 being doped p+ instead of n+, and the Vt implant region 312 being doped n− instead of p−, in accordance with certain aspects of the present disclosure. Thus, the transcap structure 300 of FIG. 5A may be referred to as a p-type gate, n-type channel transcap.

Figure 5B:
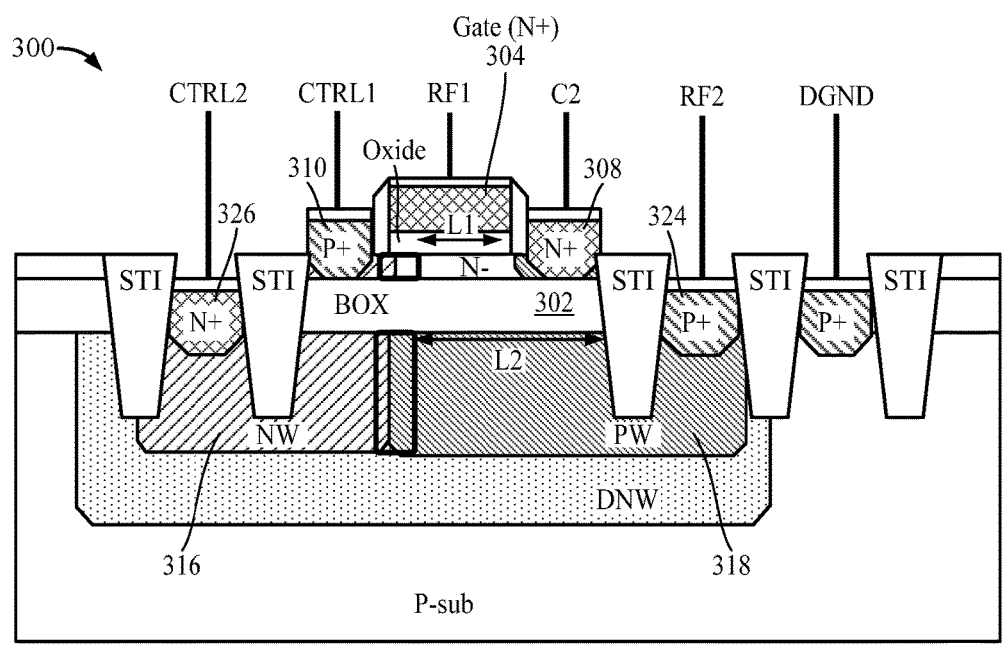
FIG. 5B illustrates a cross-sectional view of an example n-type gate, n-type channel variable semiconductor capacitor with separately tunable front gate and back gate capacitances, in accordance with certain aspects of the present disclosure.

FIG. 5B illustrates the transcap structure 300 of FIG. 5A, but with the non-insulative region 304 being doped n+ instead of p+, in accordance with certain aspects of the present disclosure. Thus, the transcap structure 300 of FIG. 5B may be referred to as an n-type gate, n-type channel transcap.

Figure 6A:
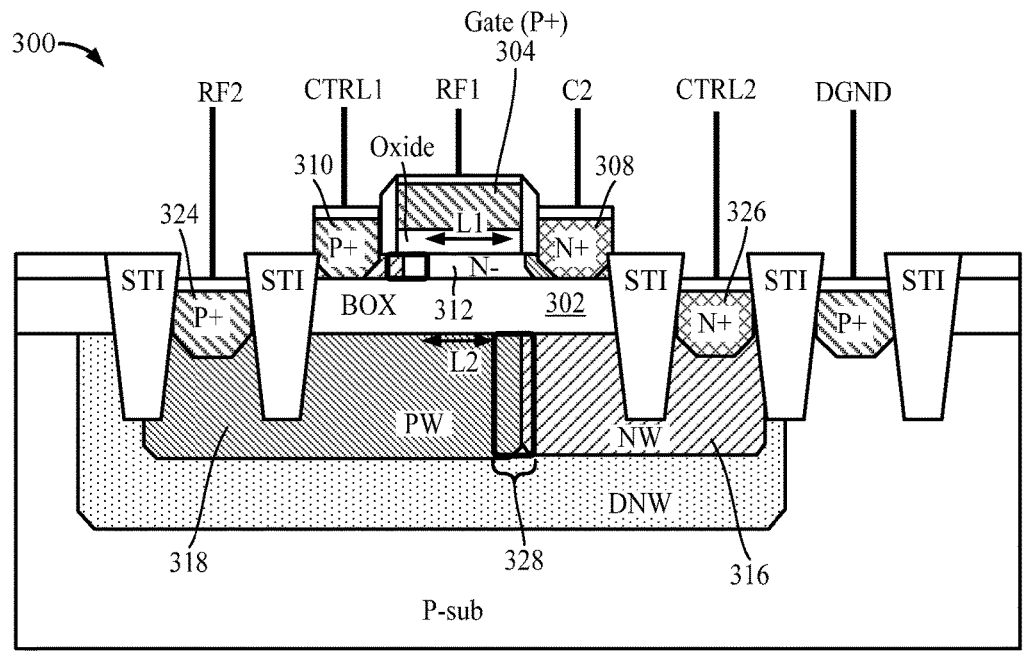
FIG. 6A illustrates a cross-sectional view of an example p-type gate, n-type channel variable semiconductor capacitor with separately tunable front gate and back gate capacitances, with a shorter back gate channel length than in FIG. 5A, in accordance with certain aspects of the present disclosure.

FIG. 6A illustrates the transcap structure 300 of FIG. 4A with the shorter back gate length (L2) compared to FIG. 3A, but with the non-insulative region 308 being doped n+ instead of p+, the control region 310 being doped p+ instead of n+, and the Vt implant region 312 being doped n– instead of p–, in accordance with certain aspects of the present disclosure. Thus, the transcap structure 300 of FIG. 6A may be referred to as a p-type gate, n-type channel transcap.

Figure 6B:
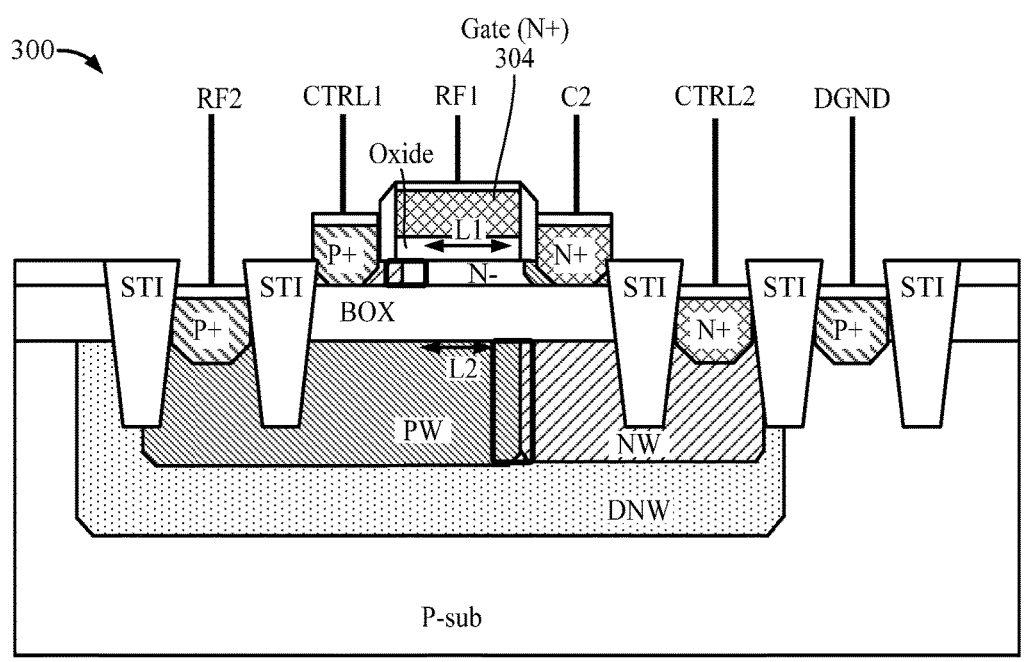
FIG. 6B illustrates a cross-sectional view of an example n-type gate, n-type channel variable semiconductor capacitor with separately tunable front gate and back gate capacitances, with a shorter back gate channel length than in FIG. 5B, in accordance with certain aspects of the present disclosure.

FIG. 6B illustrates the transcap structure 300 of FIG. 6A, but with the non-insulative region 304 being doped n+ instead of p+, in accordance with certain aspects of the present disclosure. Thus, the transcap structure 300 of FIG. 6B may be referred to as an n-type gate, n-type channel transcap.

Figure 7A:
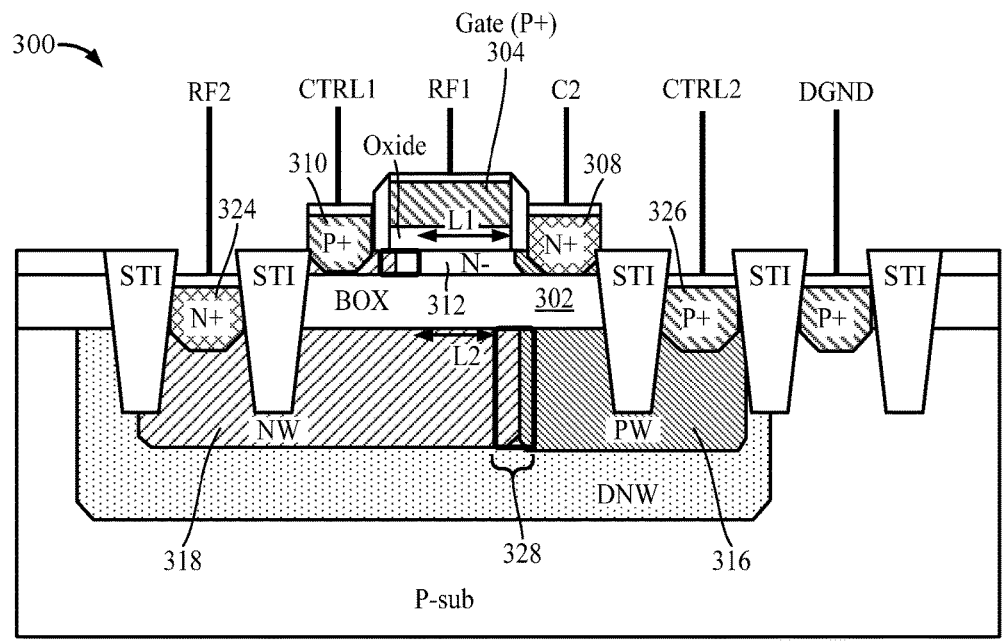
FIG. 7A illustrates a cross-sectional view of an example p-type gate, n-type channel variable semiconductor capacitor with separately tunable front gate and back gate capacitances as in FIG. 5A, but with a shorter back gate channel length disposed in an n-well (NW), rather than in a p-well (PW), in accordance with certain aspects of the present disclosure.

FIG. 7A illustrates the (p-type gate, n-type channel) transcap structure 300 of FIG. 6A with the shorter back gate length (L2) compared to FIG. 3A, but with the semiconductor region 318 being an NW region instead of a PW region, the non-insulative region 324 being doped n+ instead of p+, the semiconductor region 316 being a PW region instead of an NW region, and the control region 326 being doped p+ instead of n+, in accordance with certain aspects of the present disclosure.

Figure 7B:
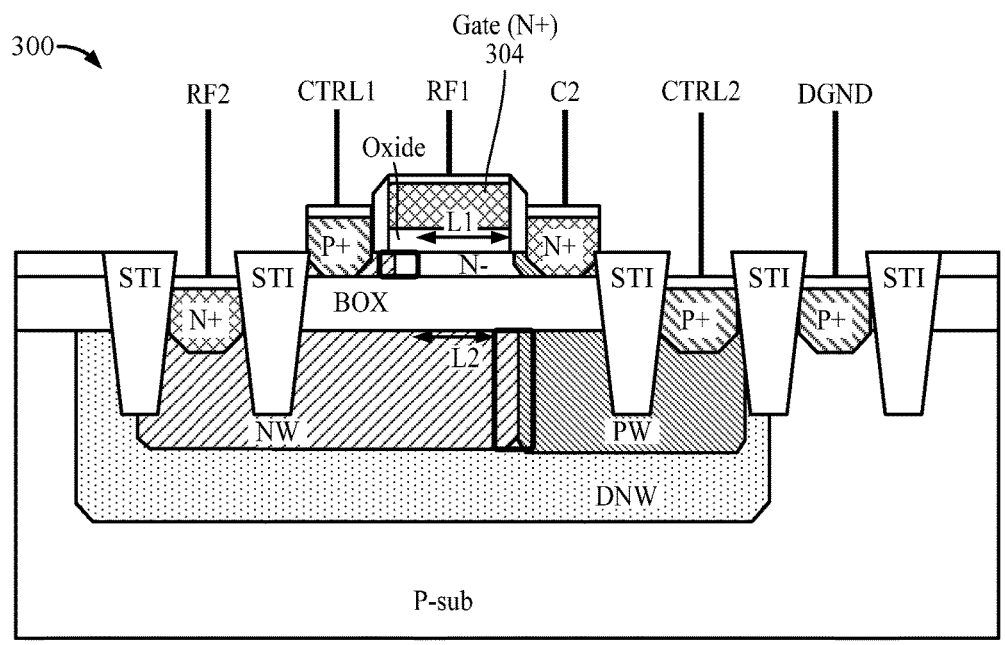
FIG. 7B illustrates a cross-sectional view of an example n-type gate, n-type channel variable semiconductor capacitor with separately tunable front gate and back gate capacitances as in FIG. 5B, but with a shorter back gate channel length disposed in an NW, rather than in a PW, in accordance with certain aspects of the present disclosure.

FIG. 7B illustrates the transcap structure 300 of FIG. 7A, but with the non-insulative region 304 being doped n+ instead of p+, in accordance with certain aspects of the present disclosure. Thus, the transcap structure 300 of FIG. 7B may be referred to as an n-type gate, n-type channel transcap.

Figure 8A:
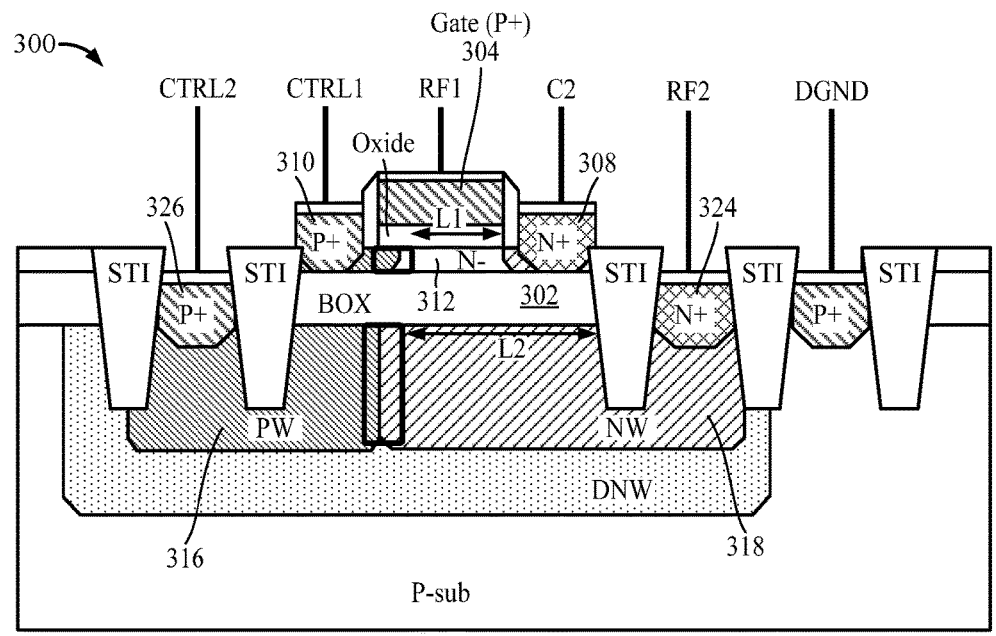
FIG. 8A illustrates a cross-sectional view of an example p-type gate, n-type channel variable semiconductor capacitor with separately tunable front gate and back gate capacitances as in FIG. 5A, but with the back gate channel disposed in an NW, rather than in a PW, in accordance with certain aspects of the present disclosure.

FIG. 8A illustrates the p-type gate, n-type channel transcap structure 300 of FIG. 5A, but with the semiconductor region 318 being an NW region instead of a PW region, the non-insulative region 324 being doped n+ instead of p+, the semiconductor region 316 being a PW region instead of an NW region, and the control region 326 being doped p+ instead of n+, in accordance with certain aspects of the present disclosure.

Figure 8B:
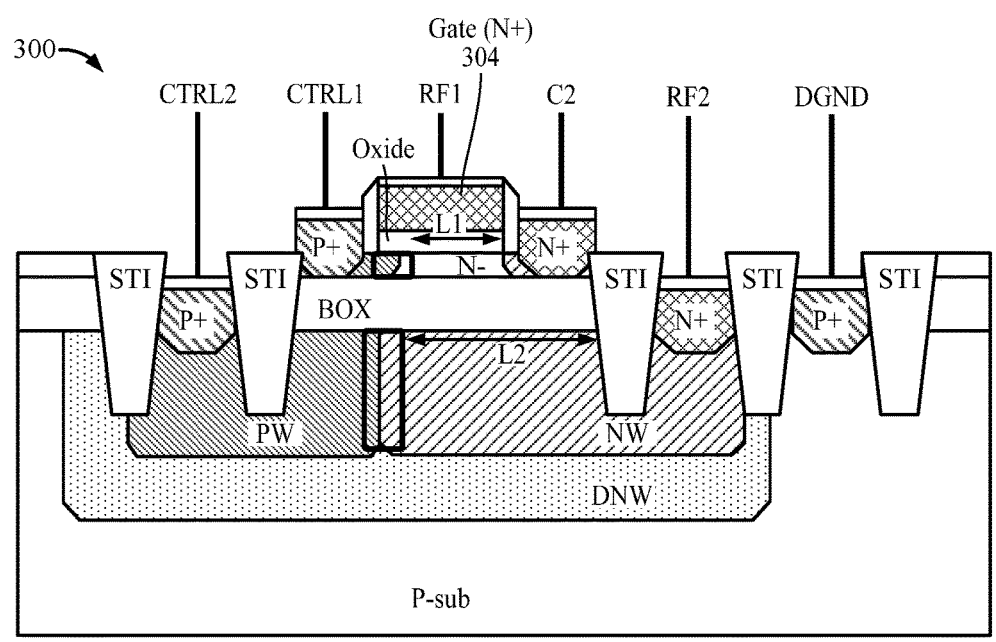
FIG. 8B illustrates a cross-sectional view of an example n-type gate, n-type channel variable semiconductor capacitor with separately tunable front gate and back gate capacitances as in FIG. 5B, but with the back gate channel disposed in an NW, rather than in a PW, in accordance with certain aspects of the present disclosure.

FIG. 8B illustrates the transcap structure 300 of FIG. 8A, but with the non-insulative region 304 being doped n+ instead of p+, in accordance with certain aspects of the present disclosure. Thus, the transcap structure 300 of FIG. 8B may be referred to as an n-type gate, n-type channel transcap.

FIG. 9A illustrates a cross-sectional view of an example differential transcap structure 900 with a pair of separately tunable front gate and back gate capacitances, for a total of four tunable capacitances, in accordance with certain aspects of the present disclosure. The differential transcap structure 900 may include a common insulative layer 902 (e.g., a buried oxide (BOX) layer), which is analogous to the insulative layer 302 in the transcap structure 300 of FIGS. 3A-8B and is shared between the two transcap devices in the differential transcap structure 900. The common insulative layer 902 may be compatible with silicon on insulator (SOI) fabrication processes (e.g., CMOS fully depleted SOI (FD-SOI) processes).

A non-insulative region 304 and a non-insulative region 904 (e.g., a gate, analogous to the non-insulative region 112 of FIG. 1) may be disposed above an oxide layer 306 and an oxide layer 906 (analogous to the oxide layer 110), respectively. Although the non-insulative regions 304 and 904 are doped p+ in FIG. 9A, the non-insulative regions 304 and 904 may alternatively be doped n+, as depicted in other aspects provided herein. The non-insulative region 304 may be coupled to a signal terminal labeled "RF1–," and the non-insulative region 904 may be coupled to a signal terminal labeled RF3+," as shown.

A common non-insulative region 908 (analogous to the non-insulative region 308 in the transcap structure 300 of FIGS. 3A-8B) may be disposed above the common insulative layer 902 and shared between the two transcap devices in the differential transcap structure 900. Sharing the common non-insulative region 908 between the two transcap devices in this manner may reduce the size of the differential transcap device, compared to using separate non-insulative regions for each transcap device. Although the common non-insulative region 908 is doped p+ in FIG. 9A, the common non-insulative region 908 may alternatively be doped n+, as portrayed in other aspects provided herein. The common non-insulative region 908 may be coupled to a signal terminal labeled "C2," as shown.

A control region 310 and a control region 910 (a non-insulative region, analogous to the non-insulative region 108 of FIG. 1) may be disposed above the common insulative layer 902. Although the control regions 310 and 910 are doped n+ in FIG. 9A, the control regions 310 and 910 may alternatively be doped p+, as portrayed in other aspects provided herein. The control region 310 may be coupled to a control terminal labeled "CTRL1," and the control region 910 may be coupled to a control terminal labeled "CTRL2," as shown. The control regions 310 and 910 may have the same doping type, which is a different doping type than the common non-insulative region 908.

The differential transcap structure 900 may also include threshold voltage (Vt) implant regions 312 and 912 interposed between the common insulative layer 902 and the non-insulative regions 304 and 904 (and more specifically, the oxide layers 306 and 906), respectively. The Vt implant regions 312 and 912 may improve the quality factor (Q) of the front gate capacitors and/or decrease the series resistances. The Vt implant regions 312 and 912 may have the same doping type. Although the Vt implant regions 312 and 912 are doped p– in FIG. 9A, the Vt implant regions 312 and 912 may alternatively be doped n–, as portrayed in other aspects provided herein. The Vt implant regions 312 and 912 may have the same doping type as the common non-insulative region 908 (e.g., all p-doped as illustrated in FIG. 9A). For certain aspects, the Vt implant regions 312 and 912 may be doped with any of various suitable dopants or implants (e.g., B or BF2).

In operation, a control voltage applied to the CTRL1 terminal (with respect to either the RF1– or the C2 terminal) may be used to adjust the capacitance between the non-insulative region 304 and the common non-insulative region 908, across the oxide layer 306. Adjusting the applied control voltage changes the width of the depletion region 314 in the Vt implant region 312, which varies the effective length of the channel (L1), adjusting the effective area for the front gate capacitor and, hence, the front gate capacitance for this transcap device. Likewise, a control voltage applied to the CTRL2 terminal (with respect to either the RF3+ or the C2 terminal) may be used to adjust the capacitance between the non-insulative region 904 and the common non-insulative region 908, across the oxide layer 906. Adjusting the applied control voltage changes the width of the depletion region 914 in the Vt implant region 912, which varies the effective length of the channel (L1), adjusting the effective area for the front gate capacitor and, hence, the front gate capacitance for this other transcap device.

The differential transcap structure 900 may also include a common semiconductor region 916 disposed beneath the common insulative layer 902. The common semiconductor region 916 may be a retrograde n-well (NW) region as illustrated in FIG. 9A, but may also be a p-well (PW) region as depicted in other aspects provided herein. Semiconductor regions 318 and 918 may be disposed beneath the common insulative layer 902 and adjacent to the common semiconductor region 916 on either side thereof. The semiconductor regions 318 and 918 may be PW regions as shown in FIG. 9A, but may also be NW regions as portrayed in other aspects provided herein. The semiconductor regions 318 and 918 may have the same doping type, which may be different from the doping type of the common semiconductor region 916.

The semiconductor regions 318 and 918 may be coupled to the non-insulative regions 324 and 924, respectively. The non-insulative regions 324 and 924 may have the same doping type. Although the non-insulative regions 324 and 924 are doped p+ in FIG. 9A, the non-insulative regions 324 and 924 may alternatively be doped n+, as depicted in other aspects provided herein. The non-insulative region 324 may be coupled to a signal terminal labeled "RF2−," and the non-insulative region 924 may be coupled to a signal terminal labeled "RF4+," as shown. RF2− may be the same signal as, or a different signal from, RF1−. Similarly, RF4+ may be the same signal as, or a different signal from, RF3+.

For certain aspects, a common semiconductor region 920 (e.g., a deep n-well (DNW) region) may be disposed beneath the semiconductor regions 318, 916, and 918. A substrate layer 322 (e.g., a p-type substrate (labeled "P-sub") as illustrated) may be disposed below the common semiconductor region 920. The substrate layer 322 may have a different doping type than the common semiconductor region 920. For certain aspects, the substrate layer 322 may be coupled to a reference potential terminal (e.g., digital ground, labeled "DGND") via a non-insulative region (not shown). The common semiconductor region 920 may be coupled to a common control region 926 (a non-insulative region), which is shared between the two transcap devices in the differential transcap structure 900. Sharing the common control region 926 between the two transcap devices in this manner may reduce the size of the differential transcap device, compared to using separate control regions. Although the common control region 926 is doped n+ in FIG. 9A, the common control region 926 may alternatively be doped p+, as portrayed in other aspects provided herein. The common control region 926 may be coupled to a control terminal labeled "CTRL3," as shown. The common control region 926 may have a different doping type than the non-insulative regions 324 and 924.

In operation, a control voltage applied to the CTRL3 terminal (with respect to either the RF2− or the C2 terminal) may be used to adjust the capacitance between the non-insulative region 324 and the common non-insulative region 908, across the common insulative layer 902. Adjusting the applied control voltage changes the width of the depletion region 328 at the p-n junction between the semiconductor regions 318 and 916, which varies the effective length of the back gate (L2), adjusting the effective area for the back gate capacitor and, hence, the back gate capacitance for this transcap device. Similarly, a control voltage applied to the CTRL3 terminal (with respect to either the RF4+ or the C2 terminal) may be used to adjust the capacitance between the non-insulative region 924 and the common non-insulative region 908, across the common insulative layer 902. Adjusting the applied control voltage changes the width of the depletion region 928 at the p-n junction between the semiconductor regions 918 and 916, which varies the effective length of the back gate (L2), adjusting the effective area for the back gate capacitor and, hence, the back gate capacitance for this other transcap device.

The back gate capacitances may offer fine tuning adjustment, whereas the front gate capacitances may offer coarse tuning adjustment. The common insulative layer 902 may have a significantly greater thickness than that of either oxide layer 306 or 906. Thus, higher control voltages may be applied to the CTRL3 terminal for adjusting the back gate capacitances than to either the CTRL1 or the CTRL 2 terminal for adjusting the front gate capacitances. For certain aspects, RF1− and RF2− may be the same signal (e.g., the RF1− and RF2− terminals may be shorted together, such that the non-insulative region 304 is electrically coupled to the non-insulative region 324). In this case, the front gate capacitance and the back gate capacitance for this transcap device are in parallel, and their capacitance values are effectively summed. Similarly, for certain aspects, RF3+ and RF4+ may be the same signal (e.g., the RF3+ and RF4+ terminals may be shorted together, such that the non-insulative region 904 is electrically coupled to the non-insulative region 924). In this case, the front gate capacitance and the back gate capacitance for this other transcap device are in parallel, and their capacitance values are effectively summed. For other aspects, RF3+ and RF4+ may be different signals.

For certain aspects, a shallow trench isolation (STI) region 340 may be disposed between the common insulative layer 902 and the non-insulative region 324, separating the layer 902 from the region 324. The STI region 340 may also be disposed above at least a portion of the semiconductor region 318. Likewise, an STI region 940 may be disposed between the common insulative layer 902 and the non-insulative region 924, separating the layer 902 from the region 924. The STI region 940 may also be disposed above at least a portion of the semiconductor region 918. For certain aspects, an STI region 942 may be disposed between the common control region 926 and the non-insulative region 924, as illustrated in FIG. 9A. Thus, the STI region 942 may isolate the non-insulative region 924 from the common control region 926.

FIG. 9B illustrates the differential transcap structure 900 of FIG. 9A, but with the common non-insulative region 908 being doped n+ instead of p+, the Vt implant regions 312 and 912 being doped n− instead of doped p−, and the control regions 310 and 910 being doped p+ instead of n+, in accordance with certain aspects of the present disclosure. Thus, the differential transcap structure 900 of FIG. 9B may be referred to as a p-type gate, n-type channel differential transcap.

Figure 9C:
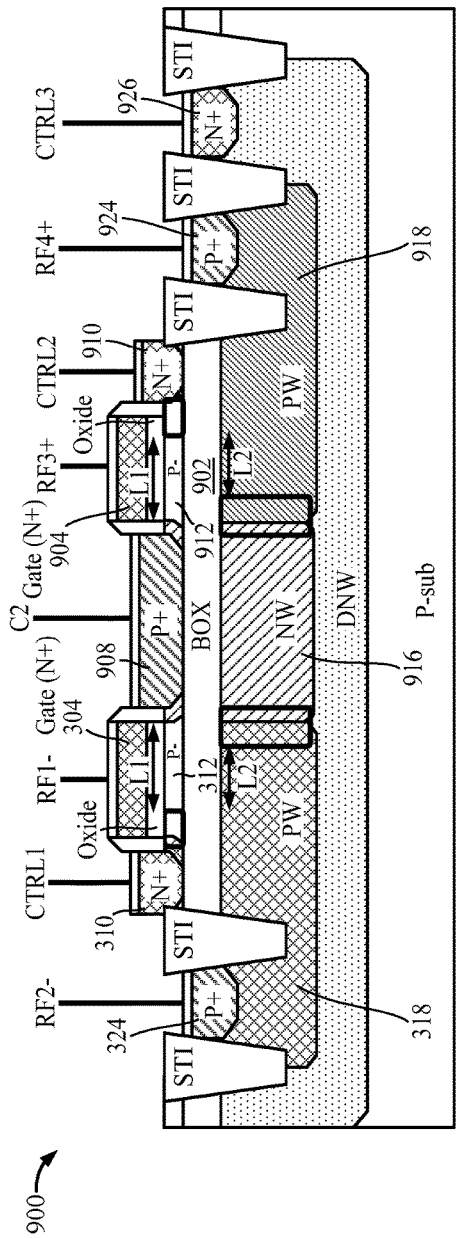
FIG. 9C illustrates a cross-sectional view of example differential n-type gate, p-type channel variable semiconductor capacitors, each with separately tunable front gate and back gate capacitances, the differential capacitors sharing a control region for tuning the back gate capacitances via a DNW, in accordance with certain aspects of the present disclosure.

FIG. 9C illustrates the differential transcap structure 900 of FIG. 9A, but with the non-insulative regions 304 and 904 being doped n+ instead of p+, in accordance with certain aspects of the present disclosure. Thus, the differential transcap structure 900 of FIG. 9C may be referred to as an n-type gate, p-type channel differential transcap.

Figure 9D:
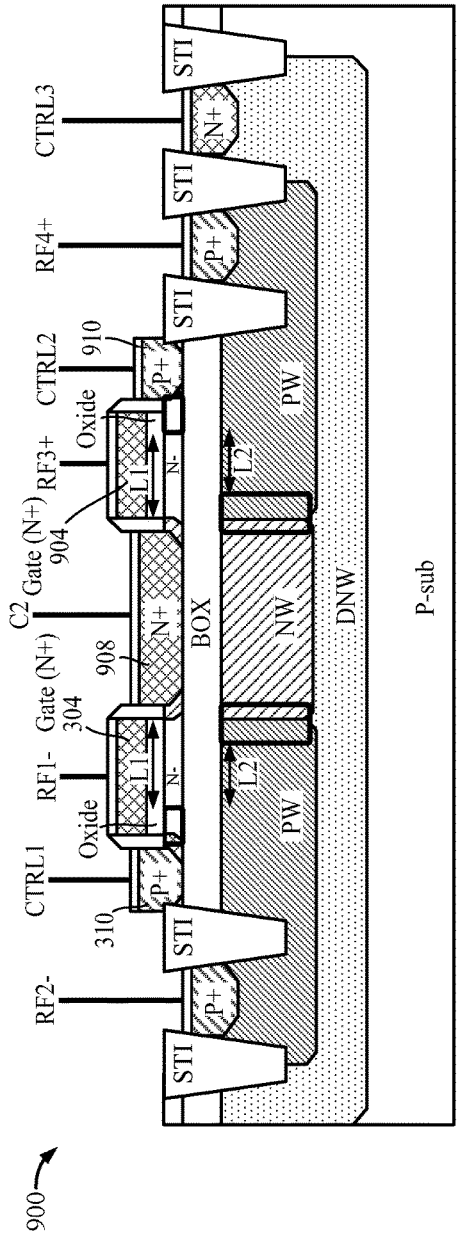
FIG. 9D illustrates a cross-sectional view of example differential n-type gate, n-type channel variable semiconductor capacitors, each with separately tunable front gate and back gate capacitances, the differential capacitors sharing a control region for tuning the back gate capacitances via a DNW, in accordance with certain aspects of the present disclosure.

FIG. 9D illustrates the differential transcap structure 900 of FIG. 9B, but with the non-insulative regions 304 and 904 being doped n+ instead of p+, in accordance with certain aspects of the present disclosure. Thus, the differential transcap structure 900 of FIG. 9D may be referred to as an n-type gate, n-type channel differential transcap.

FIG. 10A illustrates a cross-sectional view of an example differential transcap structure 1000, in accordance with certain aspects of the present disclosure. The differential transcap structure 1000 in FIG. 10A is similar to the transcap structure 900 of FIG. 9A. However, instead of a common insulative layer 902, the differential transcap structure 1000 may include two separate insulative layers 302 and 1002, one for each transcap device in the differential transcap structure. For example, the insulative layers 302 and 1002 may be buried oxide (BOX) layers. With two separate insulative layers 302 and 1002, the differential transcap structure 1000 may include two separate non-insulative regions 308 and 1008, rather than a common non-insulative region 908. The non-insulative region 1008 may be analogous to the non-insulative region 308 in the transcap structure 300 of FIGS. 3A-8B. In the differential transcap structure 1000, the non-insulative regions 308 and 1008 may be disposed above the insulative layers 302 and 1002, respectively. The non-insulative regions 308 and 1008 may have the same doping type. Although the non-insulative regions 308 and 1008 are doped p+ in FIG. 10A, the non-insulative regions 308 and 1008 may alternatively be doped n+, as portrayed in other aspects provided herein. The non-insulative regions 308 and 1008 may be coupled to separate signal terminals. These separate signal terminals may be shorted together and labeled "C2," as shown, electrically coupling the non-insulative region 308 to the non-insulative region 1008.

For certain aspects, an STI region 1050 may be disposed between the insulative layers 302 and 1002, as depicted in FIG. 10A. Thus, the STI region 1050 may isolate the insulative layers 302 and 1002, as well as the non-insulative regions 308 and 1008. The STI region 1050 may be disposed above at least a portion of the common semiconductor region 1016, which has a different shape than, but is analogous to, the common semiconductor region 916 in the differential transcap structure 900 of FIG. 9A.

FIG. 10B illustrates the differential transcap structure 1000 of FIG. 10A, but with the non-insulative regions 308 and 1008 being doped n+ instead of p+, the Vt implant regions 312 and 912 being doped n– instead of doped p–, and the control regions 310 and 910 being doped p+ instead of n+, in accordance with certain aspects of the present disclosure. Thus, the differential transcap structure 1000 of FIG. 10B may be referred to as a p-type gate, n-type channel differential transcap.

FIG. 10C illustrates the differential transcap structure 1000 of FIG. 10A, but with the non-insulative regions 304 and 904 being doped n+ instead of p+, in accordance with certain aspects of the present disclosure. Thus, the differential transcap structure 1000 of FIG. 10C may be referred to as an n-type gate, p-type channel differential transcap.

FIG. 10D illustrates the differential transcap structure 1000 of FIG. 10B, but with the non-insulative regions 304 and 904 being doped n+ instead of p+, in accordance with certain aspects of the present disclosure. Thus, the differential transcap structure 1000 of FIG. 10D may be referred to as an n-type gate, n-type channel differential transcap.

FIG. 11A illustrates a cross-sectional view of an example differential transcap structure 1100, in accordance with certain aspects of the present disclosure. The differential transcap structure 1100 in FIG. 11A is similar to the differential transcap structure 1000 of FIG. 10A. However, instead of the common control region 926 being coupled to the common semiconductor region 1016 via the common semiconductor region 920 in the differential transcap structure 1000, the differential transcap structure 1100 includes a common control region 1126 disposed between the non-insulative regions 308 and 1008 and coupled to a common semiconductor region 1116. The common control region 1126 is analogous to the common control region 926, and may likewise be coupled to a control terminal labeled "CTRL3," as shown.

For certain aspects, STI regions 1150 and 1152 may be disposed adjacent to and on either side of the common control region 1126, as illustrated in FIG. 11A. The STI region 1150 may be disposed between and separate the insulative layer 302 and the common control region 1126. Thus, the STI region 1150 may also isolate the non-insulative region 308 from the common control region 1126. Likewise, the STI region 1152 may be disposed between and separate the insulative layer 1002 and the common control region 1126. Thus, the STI region 1152 may also isolate the non-insulative region 1008 from the common control region 1126. The STI regions 1150 and 1152 may be disposed above at least portions of the common semiconductor region 1116, which may have a different shape than, but is analogous to, the common semiconductor region 1016 in the differential transcap structure 1000 of FIG. 10A. The differential transcap structure 1100 may also include a common semiconductor region 1120, which may have a different shape than, but is analogous to, the common semiconductor region 920 in the differential transcap structures 900 and 1000.

FIG. 11B illustrates the differential transcap structure 1100 of FIG. 11A, but with the non-insulative regions 308 and 1008 being doped n+ instead of p+, the Vt implant regions 312 and 912 being doped n– instead of doped p–, and the control regions 310 and 910 being doped p+ instead of n+, in accordance with certain aspects of the present disclosure. Thus, the differential transcap structure 1100 of FIG. 11B may be referred to as a p-type gate, n-type channel differential transcap.

FIG. 11C illustrates the differential transcap structure 1100 of FIG. 11A, but with the non-insulative regions 304 and 904 being doped n+ instead of p+, in accordance with certain aspects of the present disclosure. Thus, the differential transcap structure 1100 of FIG. 11C may be referred to as an n-type gate, p-type channel differential transcap.

FIG. 11D illustrates the differential transcap structure 1100 of FIG. 11B, but with the non-insulative regions 304 and 904 being doped n+ instead of p+, in accordance with certain aspects of the present disclosure. Thus, the differential transcap structure 1100 of FIG. 11D may be referred to as an n-type gate, n-type channel differential transcap.

FIG. 12A illustrates the differential transcap structure 900 of FIG. 9A, but with the semiconductor regions 318 and 918 being NW regions instead of PW regions, with the non-insulative regions 324 and 924 respectively coupled thereto being doped n+ instead of p+, and with the common semiconductor region 916 being a PW region instead of an NW region, in accordance with certain aspects of the present disclosure.

FIG. 12B illustrates the differential transcap structure 900 of FIG. 9B, but with the semiconductor regions 318 and 918 being NW regions instead of PW regions, with the non-insulative regions 324 and 924 respectively coupled thereto being doped n+ instead of p+, and with the common semiconductor region 916 being a PW region instead of an NW region, in accordance with certain aspects of the present disclosure.

FIG. 12C illustrates the differential transcap structure 900 of FIG. 12A, but with the non-insulative regions 304 and 904 being doped n+ instead of p+, in accordance with certain aspects of the present disclosure. Thus, the differential transcap structure 900 of FIG. 12C may be referred to as an n-type gate, p-type channel differential transcap.

FIG. 12D illustrates the differential transcap structure 900 of FIG. 12B, but with the non-insulative regions 304 and 904 being doped n+ instead of p+, in accordance with certain aspects of the present disclosure. Thus, the differential transcap structure 900 of FIG. 12D may be referred to as an n-type gate, n-type channel differential transcap.

FIG. 13A illustrates the differential transcap structure 1000 of FIG. 10A, but with the semiconductor regions 318 and 918 being NW regions instead of PW regions, with the non-insulative regions 324 and 924 respectively coupled thereto being doped n+ instead of p+, and with the common semiconductor region 1016 being a PW region instead of an NW region, in accordance with certain aspects of the present disclosure.

FIG. 13B illustrates the differential transcap structure 1000 of FIG. 10B, but with the semiconductor regions 318 and 918 being NW regions instead of PW regions, with the non-insulative regions 324 and 924 respectively coupled thereto being doped n+ instead of p+, and with the common semiconductor region 1016 being a PW region instead of an NW region, in accordance with certain aspects of the present disclosure.

Figure 13C:
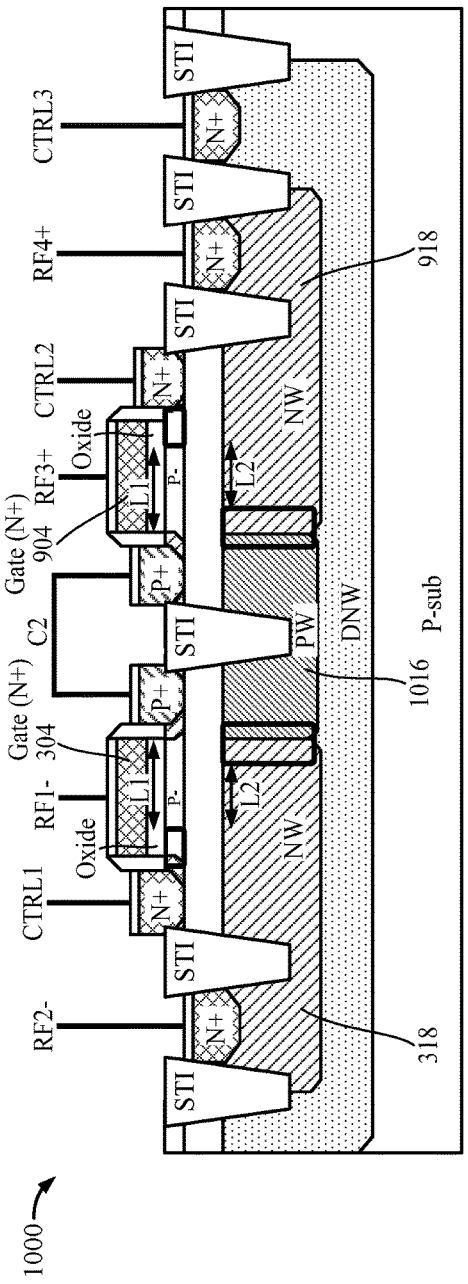

FIG. 13C illustrates the differential transcap structure 1000 of FIG. 13A, but with the non-insulative regions 304 and 904 being doped n+ instead of p+, in accordance with certain aspects of the present disclosure. Thus, the differential transcap structure 1000 of FIG. 13C may be referred to as an n-type gate, p-type channel differential transcap.

Figure 13D:
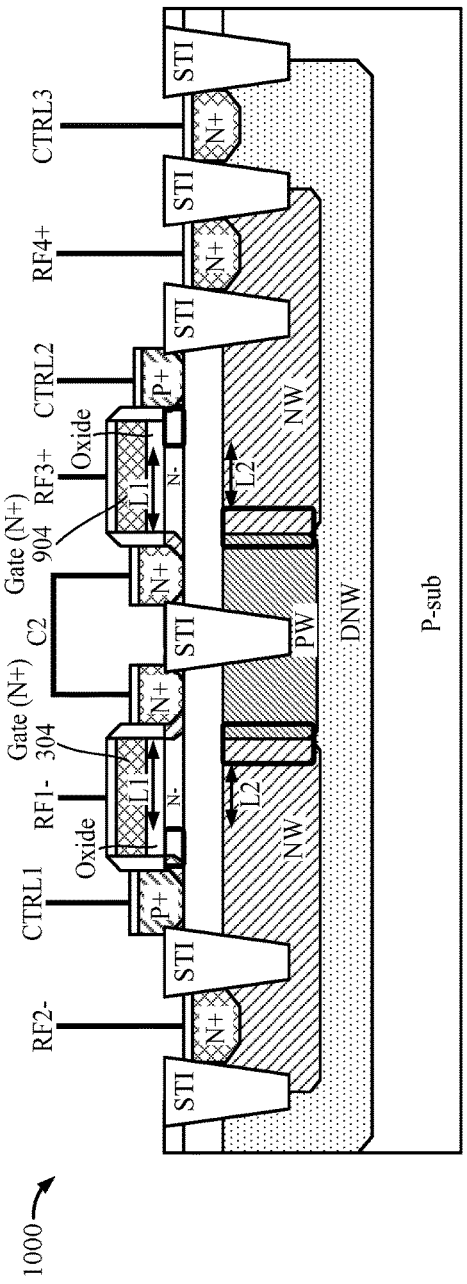

FIG. 13D illustrates the differential transcap structure 1000 of FIG. 13B, but with the non-insulative regions 304 and 904 being doped n+ instead of p+, in accordance with certain aspects of the present disclosure. Thus, the differential transcap structure 1000 of FIG. 13D may be referred to as an n-type gate, n-type channel differential transcap.

FIG. 14A illustrates the differential transcap structure 1100 of FIG. 11A, but with the semiconductor regions 318 and 918 being NW regions instead of PW regions, with the non-insulative regions 324 and 924 respectively coupled thereto being doped n+ instead of p+, and with the common semiconductor region 1116 being a PW region instead of an NW region, in accordance with certain aspects of the present disclosure.

FIG. 14B illustrates the differential transcap structure 1100 of FIG. 11B, but with the semiconductor regions 318 and 918 being NW regions instead of PW regions, with the non-insulative regions 324 and 924 respectively coupled thereto being doped n+ instead of p+, and with the common semiconductor region 1116 being a PW region instead of an NW region, in accordance with certain aspects of the present disclosure.

FIG. 14C illustrates the differential transcap structure 1100 of FIG. 14A, but with the non-insulative regions 304 and 904 being doped n+ instead of p+, in accordance with certain aspects of the present disclosure. Thus, the differential transcap structure 1100 of FIG. 14C may be referred to as an n-type gate, p-type channel differential transcap.

FIG. 14D illustrates the differential transcap structure 1100 of FIG. 14B, but with the non-insulative regions 304 and 904 being doped n+ instead of p+, in accordance with certain aspects of the present disclosure. Thus, the differential transcap structure 1100 of FIG. 14D may be referred to as an n-type gate, n-type channel differential transcap.

Figure 15:
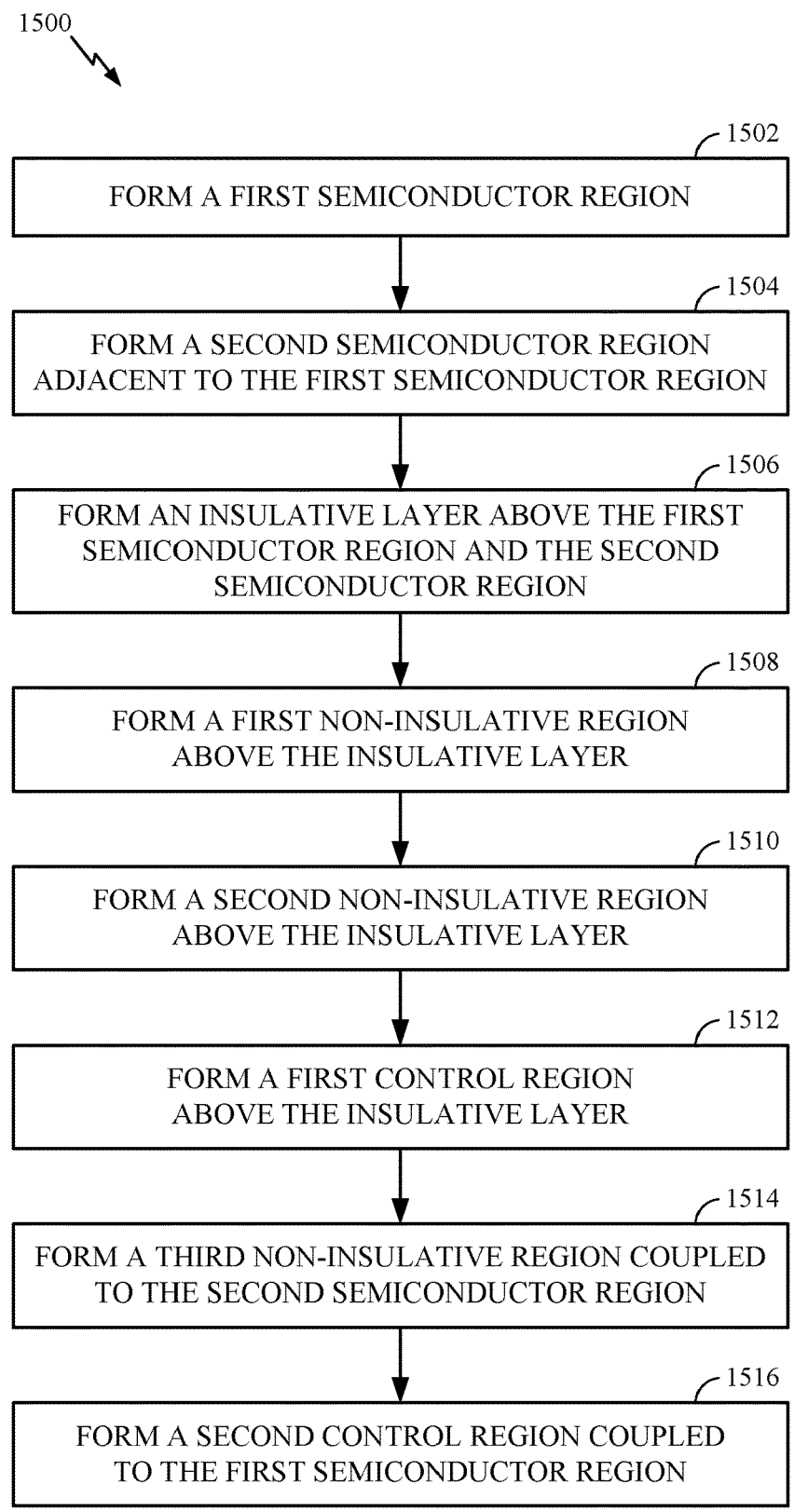
FIG. 15 is a flow diagram of example operations for fabricating a variable semiconductor capacitor, in accordance with certain aspects of the present disclosure.

FIG. 15 is a flow diagram of example operations 1500 for fabricating a semiconductor variable capacitor (e.g., the transcap structures 300, 900, 1000, and/or 1100), in accordance with certain aspects of the present disclosure. The operations 1500 may be performed by an apparatus, such as a semiconductor processing chamber.

The operations 1500 may begin, at block 1502, by forming a first semiconductor region (e.g., semiconductor region 316). For example, the first semiconductor region may be formed above a substrate (e.g., substrate layer 322) or other layer. At block 1504, a second semiconductor region (e.g., semiconductor region 318) may be formed adjacent to the first semiconductor region. The second semiconductor region comprises a different doping type than the first semiconductor region. At block 1506, an insulative layer (e.g., insulative layer 302) may be formed above the first semiconductor region and the second semiconductor region. At block 1508, a first non-insulative region (e.g., non-insulative region 304) may be formed above the insulative layer, and a second non-insulative region (e.g., non-insulative region 308) may be formed above the insulative layer at block 1510. At block 1512, a first control region may be formed above the insulative layer such that a first capacitance between the first non-insulative region and the second non-insulative region is configured to be adjusted by varying a first control voltage applied to the first control region. A third non-insulative region (e.g., non-insulative region 324) may be formed at block 1514 and may be coupled to the second semiconductor region. At block 1516, a second control region (e.g., control region 326) may be formed and may be coupled to the first semiconductor region such that a second capacitance between the third non-insulative region and the second non-insulative region is configured to be adjusted by varying a second control voltage applied to the second control region.

According to certain aspects, the second capacitance provides a finer capacitance adjustment than the first capacitance.

According to certain aspects, the operations 1500 may further include forming a third semiconductor region (e.g., semiconductor region 918) adjacent to the first semiconductor region, wherein the third semiconductor region comprises a different doping type than the first semiconductor region; forming a fourth non-insulative region (e.g., non-insulative region 904) above the insulative layer; forming a third control region (e.g., control region 910) above the insulative layer such that a third capacitance between the fourth non-insulative region and the second non-insulative region is configured to be adjusted by varying a third control voltage applied to the third control region; forming a fifth non-insulative region (e.g., non-insulative region 924) coupled to the third semiconductor region; and forming a fourth semiconductor region (e.g., common semiconductor region 920). In this case, the first, second, and third semiconductor regions may be formed above the fourth semiconductor region; and the second control region may be coupled to the first semiconductor region via the fourth semiconductor region such that a fourth capacitance between the fifth non-insulative region and the second non-insulative region is configured to be adjusted by varying the second control voltage applied to the second control region.

According to certain aspects, the operations 1500 may further include forming a third semiconductor region (e.g., semiconductor region 918) adjacent to the first semiconductor region, wherein the third semiconductor region comprises a different doping type than the first semiconductor region; forming another insulative layer (e.g., insulative layer 1002) above the first semiconductor region and the third semiconductor region; forming a fourth non-insulative region (e.g., non-insulative region 904) above the other insulative layer; forming a fifth non-insulative region (e.g., non-insulative region 1008) above the other insulative layer; forming a third control region (e.g., control region 910) above the other insulative layer such that a third capacitance between the fourth non-insulative region and the fifth non-insulative region is configured to be adjusted by varying a third control voltage applied to the third control region; and forming a sixth non-insulative region (e.g., non-insulative region 924) coupled to the third semiconductor region, wherein the second control region is coupled to the first semiconductor region such that a fourth capacitance between the sixth non-insulative region and the fifth non-insulative region is configured to be adjusted by varying the second control voltage applied to the second control region.

Aspects of the present disclosure provide several advantages. For example, aspects of the present disclosure offer transcap devices with at least two types of capacitance tuning. The fabrication processes for these transcap devices may include CMOS-compatible silicon on insulator (SOI) processes with a buried oxide (BOX) layer, which may be low cost. These processes may provide transcap devices with a front gate (above the BOX layer) and a back gate (beneath the BOX layer). The front gate may offer lower voltage, coarse capacitance tuning, whereas the back gate may offer higher voltage, fine capacitance tuning. By offering both types of capacitance tuning, such transcaps may provide greater capacitance resolution.

Furthermore, using n-doped or p-doped Vt implant regions may reduce n-type or p-type channel accumulation mode surface resistance and may increase the Q of the TC device. Moreover, using the DNW in the back gate may isolate RF noise from the substrate layer (e.g., P-sub). The shared C2 and/or CTRL3 terminals may reduce the size of the differential transcap devices, as described above. Certain aspects of the present disclosure also use n+ or p+ doped for n or p channel transcap devices, which may reduce the gate depletion therein. Certain aspects of the present disclosure also provide transcap devices that can be scaled with high-k/metal gate (HK/MG) and fin field-effect transistor (fin-FET) technologies.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A semiconductor variable capacitor, comprising:
   a first insulative layer;
   a first non-insulative region disposed above the first insulative layer;
   a second non-insulative region disposed above the first insulative layer;
   a first control region disposed above the first insulative layer such that a first capacitance between the first non-insulative region and the second non-insulative region is configured to be adjusted by varying a first control voltage applied to the first control region;
   a first semiconductor region disposed beneath the first insulative layer;
   a second semiconductor region disposed beneath the first insulative layer and adjacent to the first semiconductor region, wherein the second semiconductor region comprises a doping type different than a doping type of the first semiconductor region;
   a third non-insulative region coupled to the second semiconductor region; and
   a second control region coupled to the first semiconductor region such that a second capacitance between the third non-insulative region and the second non-insulative region is configured to be adjusted by varying a second control voltage applied to the second control region.

2. The semiconductor variable capacitor of claim 1, wherein the second control voltage provides a capacitance adjustment finer than a capacitance adjustment of the first control voltage.

3. The semiconductor variable capacitor of claim 1, further comprising a threshold voltage (Vt) implant region interposed between the first non-insulative region and the first insulative layer and disposed adjacent to the second non-insulative region, wherein the Vt implant region comprises a doping type as the same as a doping type of the second non-insulative region.

4. The semiconductor variable capacitor of claim 3, wherein the Vt implant region comprises the doping type different than a doping type of the first non-insulative region.

5. The semiconductor variable capacitor of claim 1, wherein a doping type of the second non-insulative region is different than a doping type of the first control region.

6. The semiconductor variable capacitor of claim 5, wherein the first non-insulative region comprises a doping type as the same as the doping type of the second non-insulative region.

7. The semiconductor variable capacitor of claim 1, further comprising a third semiconductor region disposed beneath the first semiconductor region and the second semiconductor region.

8. The semiconductor variable capacitor of claim 7, wherein the third semiconductor region comprises a doping type different than the doping type of the second semiconductor region.

9. The semiconductor variable capacitor of claim 7, further comprising a substrate layer disposed below the third semiconductor region, wherein the substrate layer comprises a doping type different than a doping type of the third semiconductor region and wherein the substrate layer is coupled to a reference potential terminal.

10. The semiconductor variable capacitor of claim 1, further comprising:
   a first shallow trench isolation (STI) region disposed between the first insulative layer and the second control region and disposed above at least a portion of the first semiconductor region, wherein the first semiconductor region is electrically coupled to the second control region; and
   a second STI region disposed between the first insulative layer and the third non-insulative region and disposed above at least a portion of the second semiconductor region, wherein the second semiconductor region is electrically coupled to the third non-insulative region.

11. The semiconductor variable capacitor of claim 1, wherein the first insulative layer comprises a buried oxide (BOX) layer.

12. The semiconductor variable capacitor of claim 1, wherein the third non-insulative region is electrically coupled to the first non-insulative region such that the first capacitance and the second capacitance are in parallel.

13. The semiconductor variable capacitor of claim 1, wherein the first semiconductor region comprises an n-well (NW) region and wherein the second semiconductor region comprises a p-well (PW) region.

14. The semiconductor variable capacitor of claim 1, wherein at least a portion of a depletion region between the first semiconductor region and the second semiconductor region is disposed underneath an area between the first non-insulative region and the second non-insulative region.

15. The semiconductor variable capacitor of claim 1, wherein at least a portion of a depletion region between the first semiconductor region and the second semiconductor region is disposed underneath an area between the first non-insulative region and the first control region.

16. The semiconductor variable capacitor of claim 1, further comprising:
   a fourth non-insulative region disposed above the first insulative layer;
   a third control region disposed above the first insulative layer such that a third capacitance between the fourth non-insulative region and the second non-insulative region is configured to be adjusted by varying a third control voltage applied to the third control region;
   a third semiconductor region disposed beneath the first insulative layer, wherein the third semiconductor region comprises a doping type different than the doping type of the first semiconductor region;
   a fifth non-insulative region coupled to the third semiconductor region; and
   a fourth semiconductor region disposed beneath the first semiconductor region, the second semiconductor region, and the third semiconductor region, wherein the second control region is coupled to the first semiconductor region via the fourth semiconductor region such that a fourth capacitance between the fifth non-insulative region and the second non-insulative region is configured to be adjusted by varying the second control voltage applied to the second control region.

17. The semiconductor variable capacitor of claim 16, wherein the fourth semiconductor region comprises a deep n-well (DNW) region and wherein the first semiconductor region comprises an n-well (NW) region.

18. The semiconductor variable capacitor of claim 16, wherein the second capacitance provides a capacitance adjustment finer than a capacitance adjustment of the first capacitance and wherein the fourth capacitance provides a capacitance adjustment finer than a capacitance adjustment of the third capacitance.

19. The semiconductor variable capacitor of claim 16, further comprising:
   a first threshold voltage (Vt) implant region interposed between the first non-insulative region and the first insulative layer and disposed adjacent to the second non-insulative region; and
   a second Vt implant region interposed between the fourth non-insulative region and the insulative layer and disposed adjacent to the second non-insulative region, wherein the first Vt implant region and the second Vt implant region each comprise a doping type as the same as a doping type of the second non-insulative region.

20. The semiconductor variable capacitor of claim 16, wherein the first control region and the third control region have the same doping type and wherein the second non-insulative region and the first control region have different doping types.

21. The semiconductor variable capacitor of claim 20, wherein the second non-insulative region comprises the doping type as the same as a doping type of each of the first non-insulative region and the fourth non-insulative region.

22. The semiconductor variable capacitor of claim 21, wherein the second non-insulative region comprises the doping type as the same as a doping type of each of the third non-insulative region and the fifth non-insulative region.

23. The semiconductor variable capacitor of claim 20, wherein the first non-insulative region and the fourth non-insulative region each comprise a doping type as the same as the doping type of each of the first control region and the third control region.

24. The semiconductor variable capacitor of claim 1, further comprising:
   a second insulative layer separate from the first insuative layer;
   a fourth non-insulative region disposed above the other second insulative layer;
   a fifth non-insulative region disposed above the other second insulative layer;
   a third control region disposed above the second insulative layer such that a third capacitance between the fourth non-insulative region and the fifth non-insulative region is configured to be adjusted by varying a third control voltage applied to the third control region;
   a third semiconductor region disposed beneath the second insulative layer, wherein the third semiconductor region comprises a doping type different than the doping type of the first semiconductor region; and
   a sixth non-insulative region coupled to the third semiconductor region, wherein the second control region is coupled to the first semiconductor region such that a fourth capacitance between the sixth non-insulative region and the fifth non-insulative region is configured to be adjusted by varying the second control voltage applied to the second control region.

25. The semiconductor variable capacitor of claim 24, wherein the second non-insulative region is electrically coupled to the fifth non-insulative region.

26. The semiconductor variable capacitor of claim 24, wherein the second control voltage provides a capacitance adjustment finer than a capacitance adjustment of the first control voltage and wherein the fourth control voltage provides a capacitance adjustment finer than a capacitance adjustment of the third control voltage.

27. The semiconductor variable capacitor of claim 24, further comprising:
   a first threshold voltage (Vt) implant region interposed between the first non-insulative region and the first insulative layer and disposed adjacent to the second non-insulative region, wherein the first Vt implant region comprises a doping type as the same as a doping type of the second non-insulative region; and
   a second Vt implant region interposed between the fourth non-insulative region and the second insulative layer and disposed adjacent to the fifth non-insulative region, wherein the second Vt implant region comprises a doping type as the same as a doping type of the fifth non-insulative region.

28. The semiconductor variable capacitor of claim 24, further comprising:
   a first shallow trench isolation (STI) region disposed between the first insulative layer and the second control region, wherein the first STI region is disposed above at least a first portion of the first semiconductor region; and
   a second STI region disposed between the second control region and the second insulative layer, wherein the second STI region is disposed above at least a second portion of the first semiconductor region.

29. The semiconductor variable capacitor of claim 24, further comprising a fourth semiconductor region disposed beneath the first semiconductor region, the second semiconductor region, and the third semiconductor region, wherein the second control region is coupled to the first semiconductor region via the fourth semiconductor region.

30. The semiconductor variable capacitor of claim 29, further comprising a shallow trench isolation (STI) region disposed between the first insulative layer and the second insulative layer and disposed above at least a portion of the first semiconductor region.

* * * * *